(12) United States Patent
Park

(10) Patent No.: US 10,243,103 B2
(45) Date of Patent: Mar. 26, 2019

(54) ULTRAVIOLET LIGHT EMITTING DIODE, LIGHT EMITTING DIODE PACKAGE, AND LIGHTING DEVICE

(71) Applicant: LG INNOTEK CO., LTD., Seoul (KR)

(72) Inventor: Chan Keun Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/579,800

(22) PCT Filed: Jun. 24, 2016

(86) PCT No.: PCT/KR2016/006734
§ 371 (c)(1),
(2) Date: Dec. 5, 2017

(87) PCT Pub. No.: WO2016/209015
PCT Pub. Date: Dec. 29, 2016

(65) Prior Publication Data
US 2018/0158981 A1 Jun. 7, 2018

(30) Foreign Application Priority Data

Jun. 25, 2015 (KR) .................. 10-2015-0090700
Jul. 2, 2015 (KR) .................. 10-2015-0094869

(51) Int. Cl.
*H01L 33/20* (2010.01)
*H01L 33/02* (2010.01)
(Continued)

(52) U.S. Cl.
CPC .............. *H01L 33/20* (2013.01); *H01L 33/00* (2013.01); *H01L 33/007* (2013.01);
(Continued)

(58) Field of Classification Search
None
See application file for complete search history.

(56) References Cited

U.S. PATENT DOCUMENTS 8,698,163 B2 * 4/2014 Ting .................. H01L 21/02458
257/13
8,952,400 B2 * 2/2015 Jung .................. H01L 33/02
257/257
(Continued)

FOREIGN PATENT DOCUMENTS

JP 2014-103377 A 6/2014
KR 10-2011-0069326 A 6/2011
(Continued)

OTHER PUBLICATIONS

Zhang, J. P., Wang, H. M., Gaevski, M. E., Chen, C. Q., Fareed, Q., Yang, J. W., Simin, G., & Khan, M. A. (May 13, 2002). Crack-Free Thick AlGaN Grown on Sapphire using AlN/AlGaN Superlattices for Strain Management. Applied Physics Letters, 80 (19), 3542-3544. http://dx.doi.org/10.1063/1.1477620.*
International Search Report, issued in PCT/KR2016/006734, PCT/ISA/210, dated Oct. 17, 2016.

*Primary Examiner* — Joseph Schoenholtz
(74) *Attorney, Agent, or Firm* — Birch, Stewart, Kolasch & Birch, LLP

(57) ABSTRACT

Embodiments relates to an ultraviolet light emitting diode, a method of manufacturing an ultraviolet light emitting diode, a light emitting diode package, and a LIGHTING DEVICE. An ultraviolet light emitting diode according to an embodiment includes: a substrate; a first undoped GaN layer including a planar upper surface and a V-pit on the substrate; a first nitride layer on the V-pit of the first undoped GaN layer; a first undoped AlGaN-based semiconductor layer on the first undoped GaN layer and the first nitride layer; and a second undoped GaN layer on the first undoped AlGaN-based semiconductor layer, wherein the first undoped AlGaN-based semiconductor layer includes a first region on the planar upper surface of the first undoped GaN layer and a second region located on the V-pit of of the first undoped GaN layer, and wherein an Al concentration of the first region may be greater than that of the second region.

15 Claims, 16 Drawing Sheets

(51) Int. Cl.
    *H01L 33/00*     (2010.01)
    *H01L 33/32*     (2010.01)
    *H01L 33/22*     (2010.01)
    *H01L 33/24*     (2010.01)
    *H01L 33/14*     (2010.01)

(52) U.S. Cl.
    CPC ............ *H01L 33/025* (2013.01); *H01L 33/22* (2013.01); *H01L 33/32* (2013.01); *H01L 33/145* (2013.01)

(56) References Cited

U.S. PATENT DOCUMENTS

| | | | |
|---|---|---|---|
| 8,981,403 B2* | 3/2015 | Shatalov | H01L 21/0237 |
| | | | 257/730 |
| 9,178,114 B2* | 11/2015 | Ting | H01L 21/02505 |
| 9,287,367 B2* | 3/2016 | Kwak | H01L 21/02458 |
| 2013/0037819 A1 | 2/2013 | Jang et al. | |
| 2013/0056770 A1* | 3/2013 | Shatalov | H01L 21/0237 |
| | | | 257/94 |
| 2013/0082273 A1 | 4/2013 | Ting | |
| 2013/0285095 A1 | 10/2013 | Moon | |

FOREIGN PATENT DOCUMENTS

| | | |
|---|---|---|
| KR | 10-2013-0017462 A | 2/2013 |
| KR | 10-2013-0120615 A | 11/2013 |

\* cited by examiner

ULTRAVIOLET LIGHT EMITTING DIODE, LIGHT EMITTING DIODE PACKAGE, AND LIGHTING DEVICE

CROSS REFERENCE TO RELATED APPLICATIONS:

This application is the National Phase of PCT/KR2016/006734 filed on Jun. 24, 2016, which claims priority under 35 U.S.C. § 119(a) to Patent Application Nos. 10-2015-0090700 and 10-2015-0094869 filed in the Republic of Korea on Jun. 25, 2015 and Jul. 2, 2015, respectively, all of which are hereby expressly incorporated by reference into the present application.

TECHNICAL FIELD

Embodiments relates to an ultraviolet light emitting diode, a method of manufacturing an ultraviolet light emitting diode, a light emitting diode package, and a LIGHTING DEVICE.

BACKGROUND ART

A light emitting diode is a p-n junction diode having a characteristic in which electric energy is converted into light energy, may be formed by compounding Group III and Group V elements or Group II and Group VI elements on the periodic table and may realize various colors by adjusting a composition ratio of the compound semiconductor.

Nitride semiconductors are attracting a great attention in the development fields of optical devices and high power electronic devices due to high thermal stability and wide band-gap energy thereof. In particular, an ultraviolet (UV) light emitting diode, a blue light emitting diode, a green light emitting diode, a red light emitting diode and the like using the nitride semiconductor are commercialized and used widely.

The UV light emitting diode (UV LED) is a light emitting diode which emits light in a wavelength range of 200 nm to 400 nm. The ultraviolet light emitting diode may be configured with a short wavelength and a long wavelength depending on an application. The short wavelength may be used for sterilization or purification, and the long wavelength may be used for an exposure machine, a curing machine, or the like.

Meanwhile, the ultraviolet light emitting diode has a problem that light acquisition efficiency and light output are lower than those of the blue light emitting diode, which serves as a barrier in practical use of the ultraviolet light emitting diode.

For example, a Group III nitride used in an ultraviolet light emitting diode may be widely used in a range from visible light to ultraviolet light, but efficiency of ultraviolet light is lower than that of visible light, which is due to the fact that the Group III nitride absorbs ultraviolet light as the Group III nitride goes toward a wavelength of ultraviolet light and internal quantum efficiency is lowered due to low crystallinity.

Since an indium (In) composition of the ultraviolet light emitting diode is low, it is difficult to see an In localization effect compared to the blue LED in a quantum well. Therefore, in the related art, a control and crystallinity of threading dislocation coming from a lower layer affect brightness of a chip.

Meanwhile, in order to improve light extraction efficiency, the ultraviolet light emitting diode forms a light extraction pattern on an n-type semiconductor layer by a method such as photoelectrochemical (PEC).

However, the n-type semiconductor layer may cause over-etching of the light extraction pattern, and the over-etching causes a short. That is, a yield of the light extraction pattern of a general n-type semiconductor layer by the PEC is lowered due to a short or the like.

DISCLOSURE

Technical Problem

An embodiment may provide an ultraviolet light emitting diode, a method of manufacturing an ultraviolet light emitting diode, a light emitting diode package, and a LIGHTING DEVICE capable of improving brightness according to an improvement of crystal quality.

In addition, an embodiment may provide an ultraviolet light emitting diode, a method of manufacturing an ultraviolet light emitting diode, a light emitting diode package, and a LIGHTING DEVICE capable of enhancing dislocation to improve brightness.

An embodiment may provide an ultraviolet light emitting diode, a method of manufacturing an ultraviolet light emitting diode, a light emitting diode package, and a LIGHTING DEVICE capable of improving a yield.

Technical Solution

An ultraviolet light emitting diode according to an embodiment includes: a substrate; a first undoped GaN layer including a planar upper surface and a V-pit on the substrate; a first nitride layer 107 on the V-pit V of the first undoped GaN layer 106a; a first undoped AlGaN-based semiconductor layer 108 on the first undoped GaN layer 106a and the first nitride layer 107; and a second undoped GaN layer 106b on the first undoped AlGaN-based semiconductor layer 108, wherein the first undoped AlGaN-based semiconductor layer 108 includes a first region 108a on the planar upper surface of the first undoped GaN layer 106a and a second region 108b on the V-pit V of the first undoped GaN layer 106a, wherein an Al composition of the first region 108a may be greater than that of the second region 108b.

An ultraviolet light emitting diode according to another embodiment includes: a first conductive first semiconductor layer having a light extraction structure; an etching stop layer on the first conductive first semiconductor layer; a first conductive second semiconductor layer on the etching stop layer; an active layer on the first conductive second semiconductor layer; and a second conductive semiconductor layer on the active layer, wherein the etching stop layer includes AlN and a first conductive third semiconductor layer, the AlN and the first conductive third semiconductor layer being alternately disposed at at least five pairs, and the first conductive first semiconductor layer, the first conductive second semiconductor layer, and the first conductive third semiconductor layer each includes a first conductive AlGaN-based semiconductor layer.

A light emitting diode package according to an embodiment may include the ultraviolet light emitting diode.

A LIGHTING DEVICE according to an embodiment may include the ultraviolet light emitting diode.

Advantageous Effects

An embodiment can improve crystal quality of a light emitting structure, thereby improving brightness of an ultraviolet light emitting diode.

In addition, an embodiment can improve the dislocation of the light emitting structure, thereby improving the brightness of the ultraviolet light emitting diode.

Further, an embodiment can improve reduction of a yield due to a short by limiting a depth of a light extraction pattern.

MODES OF THE INVENTION

In the description of the embodiments, when it is described that each layer (film), region, pattern, or structure is formed "above/on" or "under" a substrate, each layer (film), region, pad or pattern, the description includes being formed both "directly" or "indirectly (by interposing another layer)" "above/on" and "under". Further, the reference about "on/over" or "under" each layer will be made on the basis of drawings.

Figure 1:
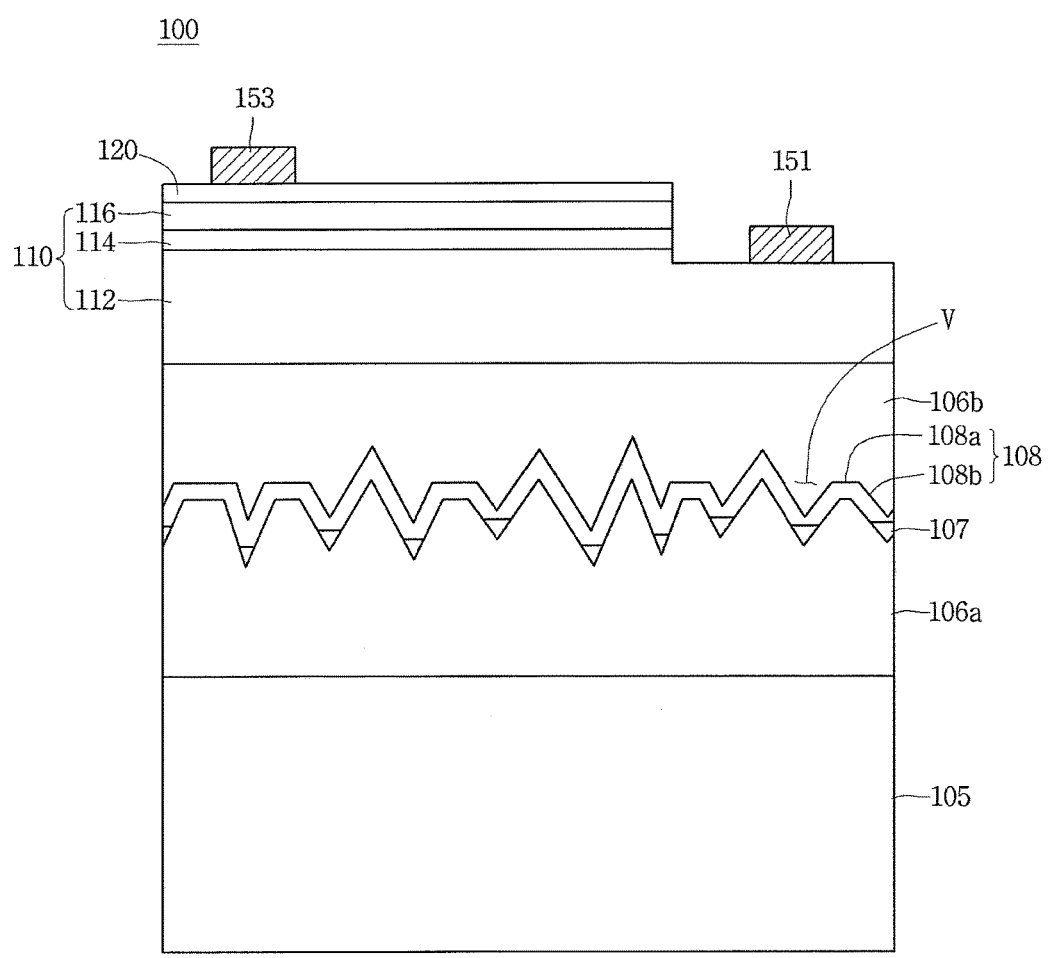
FIG. 1 is a cross-sectional view illustrating an ultraviolet light emitting diode according to an embodiment.
Figure 2:
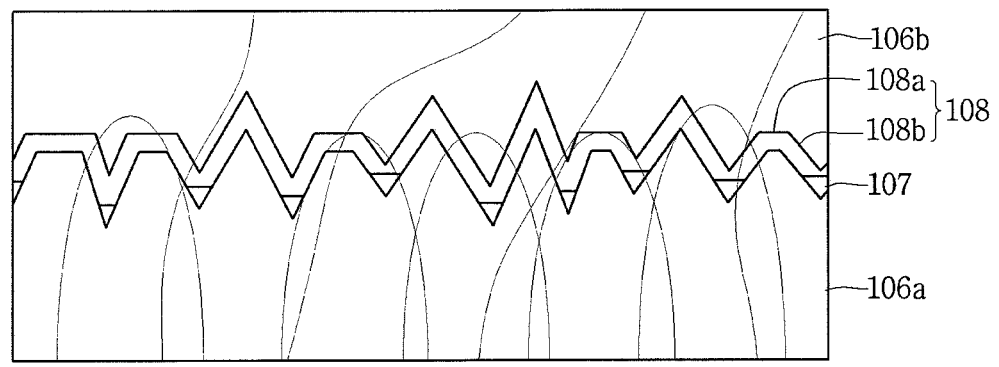
FIG. 2 is a cross-sectional view illustrating the degree of a dislocation of an ultraviolet light emitting diode including an undoped AlGaN-based semiconductor layer of FIG. 1.

FIG. 1 is a cross-sectional view illustrating an ultraviolet light emitting diode according to an embodiment, and FIG. 2 is a cross-sectional view illustrating the degree of a dislocation of an ultraviolet light emitting diode including an undoped AlGaN-based semiconductor layer of FIG. 1.

Referring to FIGS. 1 and 2, an ultraviolet light emitting diode 100 includes a first undoped GaN layer 106a, a nitride layer 107, an undoped AlGaN-based semiconductor layer 108, and a second undoped GaN layer 106b.

The first undoped GaN layer 106a may be located on a substrate 105. At least one or more of the first undoped GaN layer 106a may be formed. For example, the first undoped GaN layer 106a may be formed in plurality of two or more layers. The first undoped GaN layer 106a may have a plurality of V-pits V by controlling a growth temperature or a growth pressure. For example, the first undoped GaN layer 106a may reduce the mobility of Ga by adjusting a growth temperature, a growth pressure, or the like, and thus the first undoped GaN layer 106a including roughness can be formed. For example, the first undoped GaN layer 106a may be formed such that at least a part thereof has a side surface or an upper surface, and the side surfaces may be formed to include the plurality of V-pits V. The roughness may be formed regularly or irregularly, and is not limited thereto.

The nitride layer 107 may be located within the V-pits V. The nitride layer 107 may be formed at a lower end point of the V-pits V. The nitride layer 107 may include $SiN_x$ (x>0), but is not limited thereto. The nitride layer 107 may be formed at the V-pits V of the first undoped GaN layer 106a to improve a dislocation occurring at the lower end point of the V-pits V. For example, the nitride layer 107 is formed of an amorphous material and is formed at a lower end of the V-pits V of the first undoped GaN layer 106a, and thus can reduce a propagation of dislocation occurring at the lower end of the V-pits V to the second undoped GaN layer 106b, and can bend a path through which a dislocation propagates. The nitride layer 107 may also be located on the upper surface of the first undoped GaN layer 106a in addition to the lower end of the V-pits V, and is not limited thereto.

The undoped AlGaN-based semiconductor layer 108 may be located on the nitride layer 107. The undoped AlGaN-based semiconductor layer 108 may be in direct contact with the nitride layer 107. The undoped AlGaN-based semiconductor layer 108 may be grown on the upper surface and side surface (V-pit side surface) of the first undoped GaN layer 106a. The undoped AlGaN-based semiconductor layer 108 may include a first region 108a located on the upper surface of the first undoped GaN layer 106a and a second region 108b located on the V-pit V of the first undoped GaN layer 106a. A growth rate of the undoped AlGaN-based semiconductor layer 108 in the first region 108a may be slower than that in the second region 108b. Accordingly, an Al concentration of the undoped AlGaN-based semiconductor layer 108 in the first region 108a may be relatively greater than that in the second region 108b. That is, since the Al concentration in the first region 108a is greater than that in the second region 108b, binding energy of AlGaN in the first region 108a is greater than that in the second region 108b, and thus a dislocation propagating at the lower end of the V-pits V is bent to the second region 108b rather than the first region 108a, thereby reducing the dislocation propagating to the second undoped GaN layer 106b.

The undoped AlGaN-based semiconductor layer 108 may include a semiconductor material having a composition formula of $Al_xGa_{1-x}N$ (0.4≤x≤0.8). If the Al composition x of the undoped AlGaN-based semiconductor layer 108 is less than 0.4, a dislocation blocking of the first region 108a may be deteriorated. If the Al composition x of the undoped AlGaN-based semiconductor layer 108 exceeds 0.8, a dislocation bending effect of the second region 108b may be deteriorated.

A thickness of the undoped AlGaN-based semiconductor layer 108 may be 50 nm or less. For example, a thickness of the undoped AlGaN-based semiconductor layer 108 may be 5 nm to 15 nm. If the thickness of the undoped AlGaN-based semiconductor layer 108 is less than 5 nm, the dislocation blocking of the first region 108a may be deteriorated and the dislocation bending effect of the second region 108b may be deteriorated. If the thickness of the undoped AlGaN-based semiconductor layer 108 exceeds 15 nm, crystallinity may be deteriorated by a difference in lattice constant due to a high composition.

The second undoped GaN layer 106b may be located on the undoped AlGaN-based semiconductor layer 108. A thickness of the second undoped GaN layer 106b may be 800 nm or more. For example, a thickness of the second undoped GaN layer 106b may be 800 nm to 1500 nm. If the thickness of the second undoped GaN layer 106b is less than 800 nm, a dislocation bending effect may be deteriorated.

The ultraviolet light emitting diode 100 of an embodiment may include a light emitting structure 110. The light emitting structure 110 may be located on the second undoped GaN layer 106b. The light emitting structure 110 may be in direct contact with the second undoped GaN layer 106b.

The light emitting structure 110 may include a first conductive AlGaN-based semiconductor layer 112, an active layer 114, and a second conductive AlGaN-based semiconductor layer 116.

The first conductive AlGaN-based semiconductor layer 112 may be formed of a semiconductor compound, for example, a compound semiconductor such as Group II and Group V, Groups II and Group VI, or the like, and may be doped with a first conductive dopant. For example, the first conductive AlGaN-based semiconductor layer 112 may include a semiconductor material having a composition formula of $Al_nGa_{1-n}N$ ($0 \leq n \leq 1$). When the first conductive AlGaN-based semiconductor layer 112 is an n-type semiconductor layer, the first conductive AlGaN-based semiconductor layer 112 may include Si, Ge, Sn, Se, or Te as an n-type dopant, but is not limited thereto.

The active layer 114 may be formed with at least one of a single quantum well structure, a multi quantum well (MQW) structure, a quantum-wire structure, and a quantum dot structure.

The active layer 114 is a layer which emits light due to a difference in band gap of an energy band depending on the materials forming the active layer 114 when electrons (or holes) injected into the first conductive AlGaN-based semiconductor layer 112 combine with holes (or electrons) injected into the second conductive AlGaN-based semiconductor layer 116.

The active layer 114 may be formed with a compound semiconductor. For example, the active layer 114 may be formed with at least one of Group II and Group IV, and Group III and Group V compound semiconductors.

The active layer 114 may include a quantum well and a quantum barrier. When the active layer 114 is formed as a multi quantum well structure, a quantum well and a quantum barrier may be alternately disposed. The quantum well and the quantum barrier may be disposed of a semiconductor material having a composition formula of $In_xAl_yGa_{1-x-y}$ ($0 \leq x \leq 1, 0 \leq y \leq 1, 0 \leq x+y \leq 1$), or may be formed of one or more pairs of AlGaN/GaN, AlGaN/AlGaN, InGaN/GaN, InGaN/InGaN, InAlGaN/GaN, GaAs/AlGaAs, InGaAs/AlGaAs, GaP/AlGaP, and InGaP/AlGaP, but is not limited thereto.

The second conductive AlGaN-based semiconductor layer 116 may be formed of a semiconductor compound, for example, a compound semiconductor such as Group III and Group V, Groups II and Group VI, or the like, and may be doped with a second conductive dopant. For example, the second conductive AlGaN-based semiconductor layer 116 may include a semiconductor material having a composition formula of $Al_pGa_{1-p}N$ ($0 \leq p \leq 1$). When the second conductive AlGaN-based semiconductor layer 116 is a p-type semiconductor layer, the second conductive dopant may include Mg, Zn, Ca, Sr, or Ba as a p-type dopant.

Although the first conductive AlGaN-based semiconductor layer 112 is described as an n-type semiconductor layer and the second conductive AlGaN-based semiconductor layer 116 is described as a p-type semiconductor layer, the first conductive AlGaN-based semiconductor layer 112 may be formed as a p-type semiconductor layer, and the second conductive AlGaN-based semiconductor layer 116 may be formed as an n-type semiconductor layer, but not limited thereto. A semiconductor, for example, an n-type semiconductor layer (not shown) having a polarity opposite to that of the second conductive type may be formed on the second conductive AlGaN-based semiconductor layer 116. Accordingly, the light emitting structure 110 may be realized as any one of an n-p junction structure, a p-n junction structure, an n-p-n junction structure, and a p-n-p junction structure.

Although the light emitting structure 110 of an embodiment is described as the first conductive AlGaN-based semiconductor layer 112 and the second conductive AlGaN-based semiconductor layer 116, the light emitting structure 110 may be formed as a first conductive GaN-based semiconductor layer and a second conductive GaN-based semiconductor layer, and is not limited thereto.

The ultraviolet light emitting diode 100 of an embodiment may include a transparent electrode layer 120, first and second electrodes 151 and 153.

The transparent electrode layer 120 may be located on the second conductive AlGaN-based semiconductor layer 116. The transparent electrode layer 120 may include an ohmic layer (not shown).

The first electrode 151 may be located on the first conductive AlGaN-based semiconductor layer 112.

The second electrode 153 may be located on the second conductive AlGaN-based semiconductor layer 116.

A light extraction pattern such as a roughness may be formed on the second conductive AlGaN-based semiconductor layer 116 and the transparent electrode layer 120, and is not limited thereto.

The ultraviolet light emitting diode 100 of one embodiment can improve crystallinity of the second undoped GaN layer 106b located below the light emitting structure 110 by the undoped AlGaN semiconductor layer 108 formed on the first undoped GaN layer 106a to contact on the nitride layer 107, and improve dislocation.

Referring to FIG. 2, the ultraviolet light emitting diode 100 of one embodiment includes the first region 108a of the undoped AlGaN-based semiconductor layer 108 located on the upper surface of the first undoped GaN layer 106a and the second region 108b of the undoped AlGaN-based semiconductor layer 108 located at the V-pits V of the first undoped GaN layer 106a. A growth rate of the undoped AlGaN-based semiconductor layer 108 in the first region 108a may be slower than that in the second region 108b. Accordingly, the Al concentration of the undoped AlGaN-based semiconductor layer 108 in the first region 108a may be relatively greater than that in the second region 108b. That is, since the Al concentration in the first region 108a is greater than that in the second region 108b, binding energy of AlGaN in the first region 108a is greater than that in the second region 108b, and thus dislocation propagating at the lower end of the V-pits V is bent to the second region 108b rather than the first region 108a, thereby reducing propagation to the second undoped GaN layer 106b.

The ultraviolet light emitting diode 100 according to one embodiment is not limited to a horizontal type, and may be applied to a vertical ultraviolet light emitting diode.

FIGS. 3 to 7 are cross-sectional views illustrating a method of manufacturing an ultraviolet light emitting diode according to an embodiment.

Figure 3:
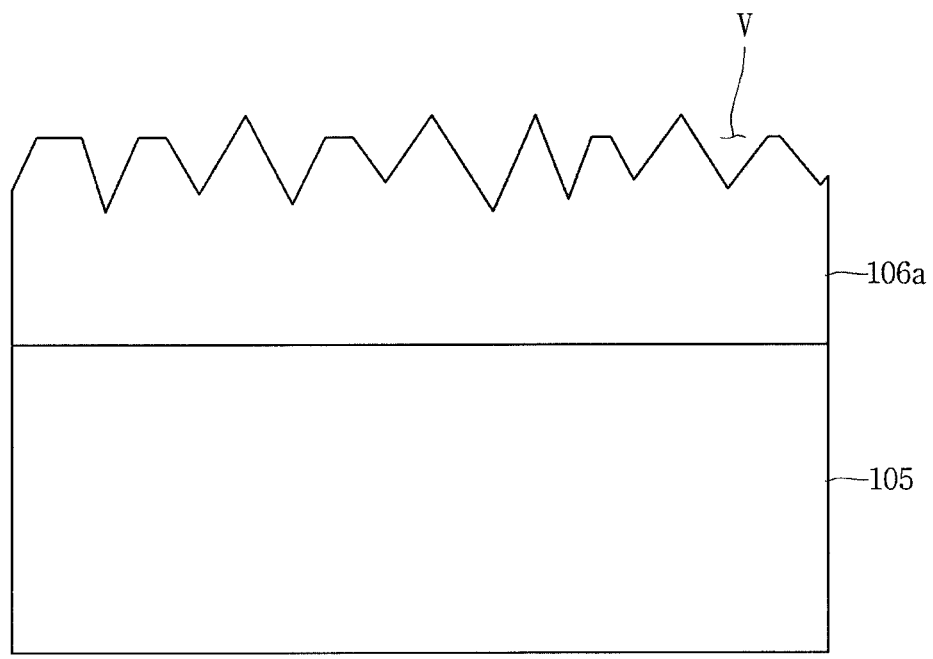
FIGS. 3 to 7 are cross-sectional views illustrating a method of manufacturing an ultraviolet light emitting diode according to an embodiment.

Referring to FIG. 3, a first undoped GaN layer 106a may be located on a substrate 105.

The substrate 105 may be formed of a material having superior thermal conductivity, and may be a conductive substrate or an insulating substrate. For example, the substrate 105 may use at least one of sapphire ($Al_2O_3$), SiC, Si, GaAs, GaN, ZnO, GaP, InP, Ge, and $Ga_2O_3$. A concavo-convex structure may be formed on the substrate 105, and is not limited thereto.

At least one or more of the first undoped GaN layer 106a may be formed. That is, the first undoped GaN layer 106a may be formed in plurality of two or more layers. The first undoped GaN layer 106a may include a plurality of V-pits V by controlling a growth temperature or pressure. For example, the first undoped GaN layer 106a may reduce mobility of Ga by adjusting a growth temperature, a growth pressure, or the like, and thus a first undoped GaN layer 106a including roughness can be formed. For example, the first undoped GaN layer 106a may be formed such that at least a part thereof has a side surface and an upper surface, and the side surfaces may be formed to include the plurality of V-pits V. For example, the roughness may be formed regularly or irregularly, and is not limited thereto.

Figure 4:
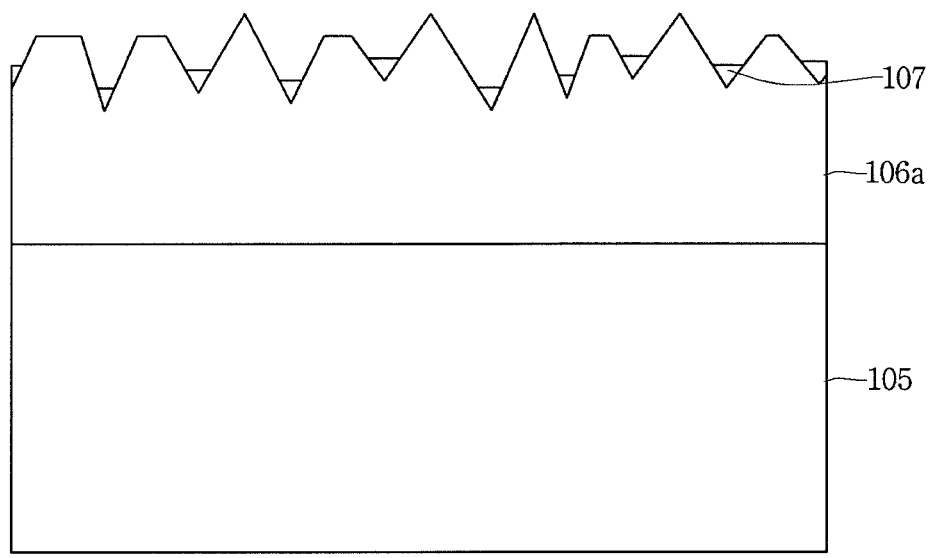

Referring to FIG. 4, a nitride layer 107 may be formed on the first undoped GaN layer 106a. The nitride layer 107 may be located within the V-pits V. The nitride layer 107 may be formed at a lower end of the V-pits V. The nitride layer 107 may include $SiN_x$ (x>0), but is not limited thereto. The nitride layer 107 may be disposed within the V-pits V of the first undoped GaN layer 106a to block a dislocation occurring at the lower end of the V-pits V. For example, the nitride layer 107 is formed of an amorphous material and is formed at the lower end of the V-pits V of the first undoped GaN layer 106a, and thus can reduce the propagation of dislocation occurring at the lower end of the V-pits to a second undoped GaN layer 106b, and bend a path through which a dislocation propagates. The nitride layer 107 may also be located on the upper surface of the first undoped GaN layer 106a in addition to the lower end of the V-pits V, and is not limited thereto.

Figure 5:
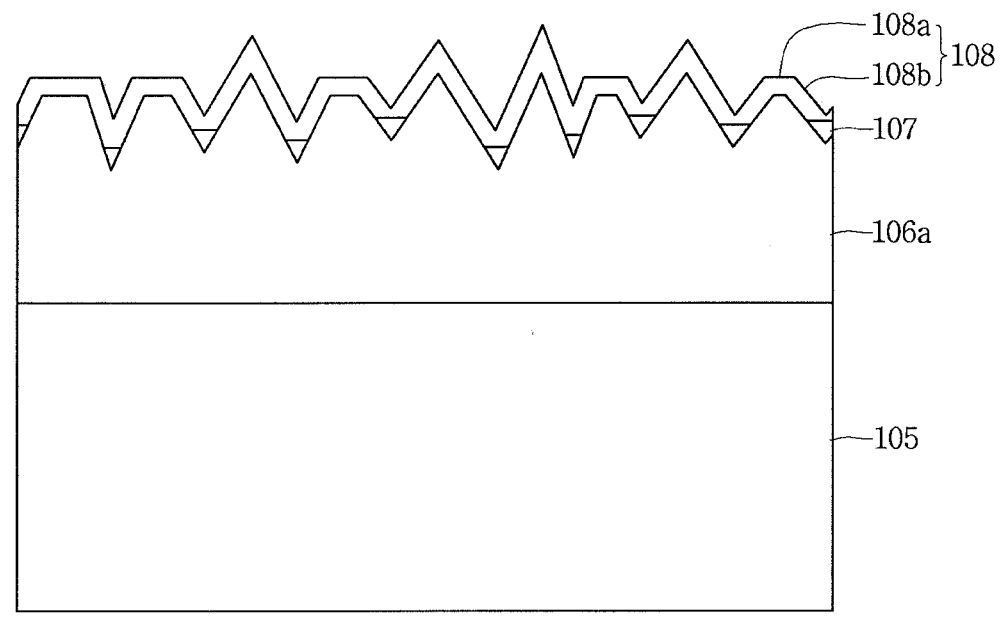

Referring to FIG. 5, an undoped AlGaN-based semiconductor layer 108 may be located on the first undoped GaN layer 106a and the nitride layer 107. The undoped AlGaN-based semiconductor layer 108 may be in direct contact with the nitride layer 107. The undoped AlGaN-based semiconductor layer 108 may be grown on the upper surface of the first undoped GaN layer 106a and a side surface of the V-pits V. The undoped AlGaN-based semiconductor layer 108 may include a first region 108a located on the upper surface of the first undoped GaN layer 106a and a second region 108b located on the V-pits V of the first undoped GaN layer 106a.

A growth rate of the undoped AlGaN-based semiconductor layer 108 in the first region 108a may be slower than that in the second region 108b. Accordingly, the Al concentration of the undoped AlGaN-based semiconductor layer 108 in the first region 108a may be relatively greater than that in the second region 108b. That is, since the Al concentration in the first region 108a is greater than that in the second region 108b, binding energy of AlGaN in the first region 108a is greater than that in the second region 108b, and thus dislocation propagating at the lower end of the V-pits V is bent to the second region 108b rather than the first region 108a, thereby reducing the dislocation propagating to the second undoped GaN layer 106b.

The undoped AlGaN-based semiconductor layer 108 may be embedded in an upper surface of the nitride layer 107 on the V-pits V side surface of the first undoped GaN layer 106a. Accordingly, the undoped AlGaN-based semiconductor layer 108 may cover the nitride layer 107.

The undoped AlGaN-based semiconductor layer 108 may include a semiconductor material having a composition formula of $Al_xGa_{1-x}N$ (0.4≤x≤0.8). If the Al composition x of the undoped AlGaN-based semiconductor layer 108 is less than 0.4, a dislocation blocking effect of the first undoped AlGaN-based semiconductor layer 108 may be deteriorated. If the Al composition x of the undoped AlGaN-based semiconductor layer 108 exceeds 0.8, a dislocation bending effect of the first undoped AlGaN-based semiconductor layer 108 may be deteriorated.

A thickness of the undoped AlGaN-based semiconductor layer 108 may be 50 nm or less. For example, a thickness of the undoped AlGaN-based semiconductor layer 108 may be 5 nm to 15 nm. If the thickness of the undoped AlGaN-based semiconductor layer 108 is less than 5 nm, the dislocation blocking effect of the first undoped AlGaN-based semiconductor layer 108 may be deteriorated and the dislocation bending effect of the second undoped AlGaN-based semiconductor layer 108 may be deteriorated. If the thickness of the undoped AlGaN-based semiconductor layer 108 exceeds 15 nm, crystallinity may be deteriorated by a difference in lattice constant due to a high composition.

Figure 6:
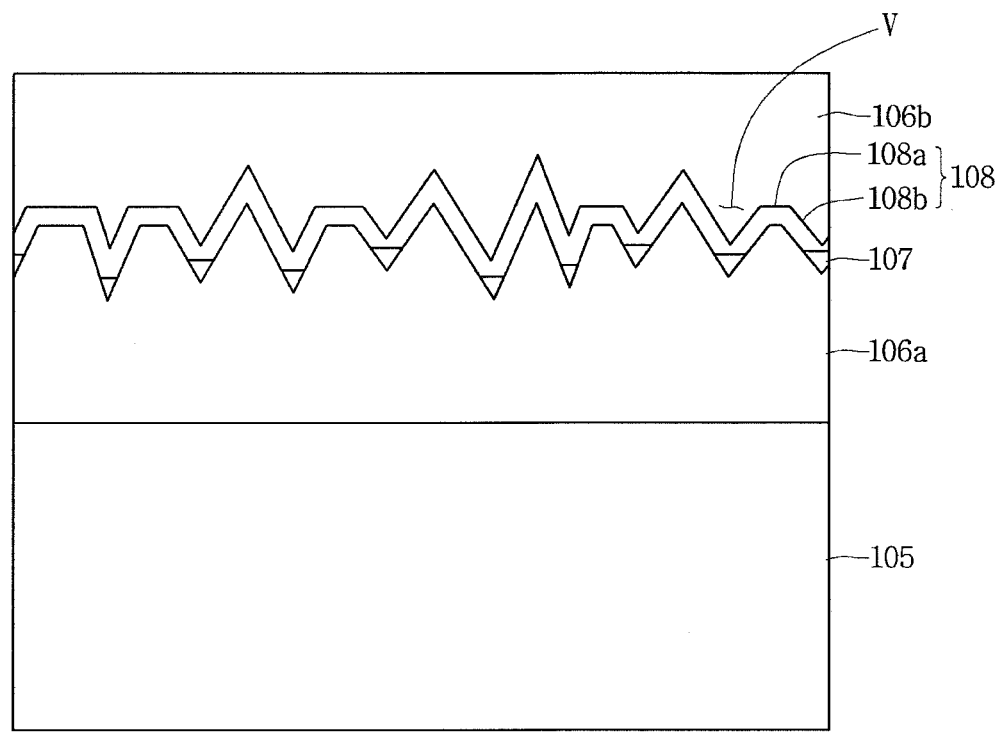

Referring to FIG. 6, the second undoped GaN layer 106b may be grown on the undoped AlGaN-based semiconductor layer 108. The second undoped GaN layer 106b may be formed on an upper and a side surface of the undoped AlGaN-based semiconductor layer 108. For example, a thickness of the second undoped GaN layer 106b may be 800 nm or more. The thickness of the second undoped GaN layer 106b may be 800 nm to 1500 nm. If the thickness of the second undoped GaN layer 106b is less than 800 nm, a dislocation bending effect may be deteriorated.

Figure 7:
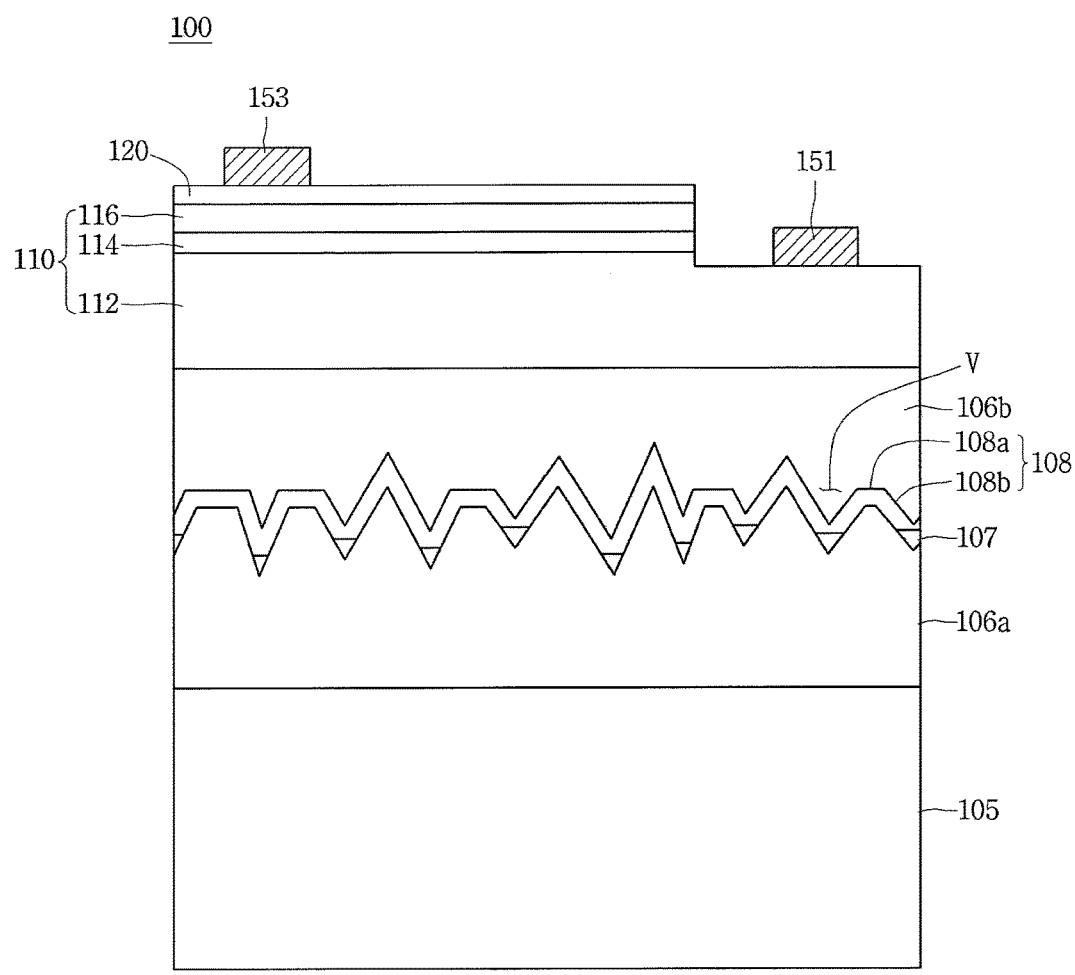

Referring to FIG. 7, a light emitting structure 110 may be formed on the second undoped GaN layer 106b. The light emitting structure 110 may include a first conductive AlGaN-based semiconductor layer 112, an active layer 114, and a second conductive AlGaN-based semiconductor layer 116.

The first conductive AlGaN-based semiconductor layer 112 may be formed of a semiconductor compound, for example, a compound semiconductor such as Group III and Group V, Groups II and Group VI, or the like, and may be doped with a first conductive dopant. For example, the second conductive AlGaN-based semiconductor layer 112 may include a semiconductor material having a composition formula of $Al_nGa_{1-n}N$ (0≤n≤1). When the first conductive AlGaN-based semiconductor layer 112 is an n-type semiconductor layer, the first conductive AlGaN-based semiconductor layer 112 may include Si, Ge, Sn, Se, or Te as an n-type dopant, but is not limited thereto.

The active layer 114 may be formed with at least one of a single quantum well structure, a multi quantum well (MQW) structure, a quantum-wire structure, and a quantum dot structure.

The active layer 114 is a layer which emits light due to a difference in band gap of an energy band depending on the materials forming the active layer 114 when electrons (or holes) injected into the first conductive AlGaN-based semiconductor layer 112 combine with holes (or electrons) injected into the second conductive AlGaN-based semiconductor layer 116.

The active layer 114 may be formed with a compound semiconductor. For example, the active layer 114 may be formed with at least one of Group II and Group IV, and Group III and Group V compound semiconductors.

The active layer 114 may include a quantum well and a quantum barrier. When the active layer 114 is formed as a multi quantum well structure, a quantum well and a quantum barrier may be alternately disposed. The quantum well and the quantum barrier may be disposed of a semiconductor material having a composition formula of $In_xAl_yGa_{1-x-y}$ ($0 \leq x \leq 1$, $0 \leq y \leq 1$, $0 \leq x+y \leq 1$), or be formed of one or more pairs of AlGaN/GaN, AlGaN/AlGaN, InGaN/GaN, InGaN/InGaN, InAlGaN/GaN, GaAs/AlGaAs, InGaAs/AlGaAs, GaP/AlGaP, and InGaP/AlGaP, but is not limited thereto.

The second conductive AlGaN-based semiconductor layer 116 may be formed of a semiconductor compound, for example, a compound semiconductor such as Group III and Group V, Groups II and Group VI, or the like, and may be doped with a second conductive dopant. For example, the second conductive AlGaN-based semiconductor layer 116 may include a semiconductor material having a composition formula of $Al_pGa_{1-p}N$ ($0 \leq p \leq 1$). When the second conductive AlGaN-based semiconductor layer 116 is a p-type semiconductor layer, the second conductive dopant may include Mg, Zn, Ca, Sr, or Ba as a p-type dopant.

The first conductive AlGaN-based semiconductor layer 112 may be formed as a p-type semiconductor layer, and the second conductive AlGaN-based semiconductor layer 116 may be formed as an n-type semiconductor layer and not limited thereto.

The ultraviolet light emitting diode of an embodiment may include a transparent electrode layer 120, first and second electrodes 151 and 154 formed on the light emitting structure 110.

The transparent electrode layer 120 may be formed on the second conductive AlGaN-based semiconductor layer 116. The transparent electrode layer 120 may include an ohmic layer (not shown) and may be formed by stacking a single metal, a metal alloy, a metal oxide, or the like in multiple layers so that hole injection can be efficiently performed.

For example, the transparent electrode layer 120 may be formed of a material having excellent electrical contact with a semiconductor. For example, the transparent electrode layer 120 may be formed to include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au, and Hf, and is not limited thereto.

A light extraction pattern may be formed on the second conductive AlGaN-based semiconductor layer 116 and the transparent electrode layer 120, and is not limited thereto.

The first electrode 151 may be formed on the first conductive AlGaN-based semiconductor layer 112 exposed from the active layer 114 and the second conductive AlGaN-based semiconductor layer 116, and the second electrode 153 may be formed on the transparent electrode layer 120.

The first electrode 151 or the second electrode 153 may be formed in a single layer or multi-layer of at least one of titanium (Ti), chromium (Cr), nickel (Ni), aluminum (Al), platinum (Pt), gold (Au), and molybdenum (Mo), but is not limited thereto.

Figure 8:
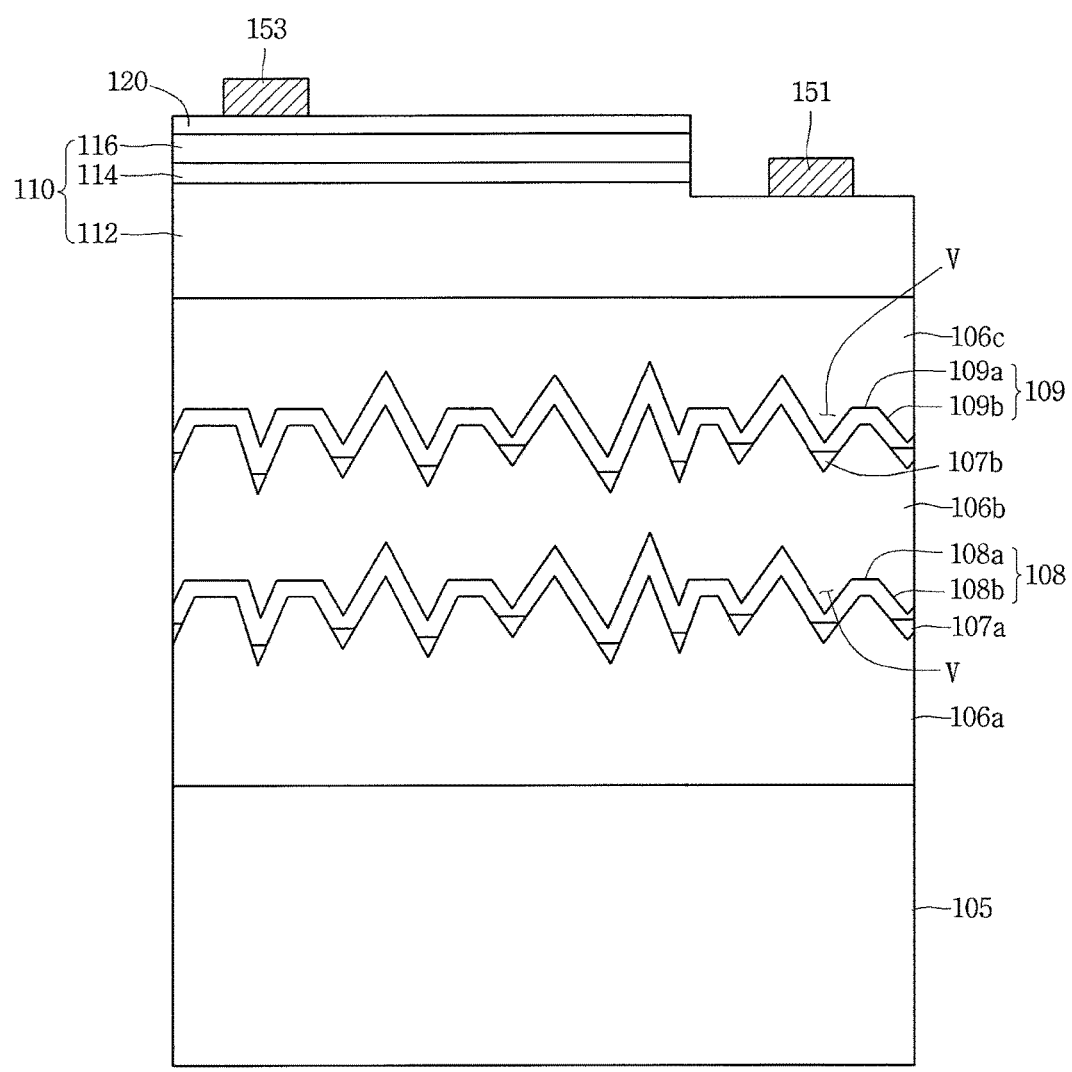
FIG. 8 is a cross-sectional view illustrating an ultraviolet light emitting diode according to another embodiment.

FIG. 8 is a cross-sectional view illustrating an ultraviolet light emitting diode according to another embodiment.

As shown in FIG. 8, the ultraviolet light emitting diode according to another embodiment may adopt technical features of the ultraviolet light emitting diode according to one embodiment of FIG. 1.

The ultraviolet light emitting diode according to another embodiment includes a first undoped GaN layer 106a, a first nitride layer 107a, a first undoped AlGaN-based semiconductor layer 108, a second undoped GaN layer 106b, a second nitride layer 107b, a second undoped AlGaN-based semiconductor layer 109, and a third undoped GaN layer 106c.

The detailed description of the first undoped GaN layer 106a including V-pits V1, the first nitride layer 107a, the first undoped AlGaN-based semiconductor layer 108, and the second undoped GaN layer 106b will be omitted with reference to the ultraviolet light emitting diode according to one embodiment. However, the second undoped GaN layer 106b may include V-pits V2.

The second nitride layer 107b may be located within the V-pits V2 of the second undoped GaN layer 106b. The second nitride layer 107b may be formed at a lower end of the V-pits V2 of the second undoped GaN layer 106b. The second nitride layer 107b may include SiNx (x>0), but is not limited thereto. The second nitride layer 107b may be formed in the V-pits V2 of the second undoped GaN layer 106b to block dislocation occurring at the lower end of the V-pits V2. For example, the second nitride layer 107b is formed of an amorphous material and is formed at the lower end of the V-pits V2 of the second undoped GaN layer 106b, and thus can reduce a propagation of dislocation occurring at the lower end of the V-pits V2 to the third undoped GaN layer 106c and bend a path through which a dislocation propagates. The second nitride layer 107b may also be located on an upper surface of the second undoped GaN layer 106b in addition to the lower end of the V-pits V2, and is not limited thereto.

The second undoped AlGaN-based semiconductor layer 109 may be located on the second nitride layer 107b. The second undoped AlGaN-based semiconductor layer 109 may be in direct contact with the second nitride layer 107b. The second undoped AlGaN-based semiconductor layer 109 may be grown on the upper surface and a side surface (V-pit side surface) of the second undoped GaN layer 106b. The second undoped AlGaN-based semiconductor layer 109 may include a third region 109a formed on the upper surface of the second undoped GaN layer 106b and a fourth region 109b formed on the V-pits V2 of the second undoped GaN layer 102b. A growth rate of the second undoped AlGaN-based semiconductor layer 109 in the third region 109a may be slower than that in the fourth region 109b. Accordingly, the Al concentration of the second undoped AlGaN-based semiconductor layer 109 in the third region 109a may be relatively greater than that in the fourth region 109b. That is, since the Al concentration in the third region 109a is greater than that in the fourth region 109b, binding energy of AlGaN in the third region 109a is greater than that in the fourth region 109b, and thus dislocation propagating at the lower end of the V-pits V2 is bent to the fourth region 109b rather than the third region 109a, thereby reducing the dislocation propagating to the third undoped GaN layer 106c.

The second undoped AlGaN-based semiconductor layer 109 may include a semiconductor material having a composition formula of $Al_yGa_{1-y}N$ ($0.4 \leq y \leq 0.8$). If the Al composition x of the second undoped AlGaN-based semiconductor layer 109 is less than 0.4, a dislocation blocking effect of the third region 109a may be deteriorated. If the Al composition x of the second undoped AlGaN-based semiconductor layer 109 exceeds 0.8, a dislocation bending effect of the fourth region 109b may be deteriorated.

A thickness of the second undoped AlGaN-based semiconductor layer 109 may be 50 nm or less. For example, a thickness of the second undoped AlGaN-based semiconductor layer 109 may be 5 nm to 15 nm. If the thickness of the second undoped AlGaN-based semiconductor layer 109 is less than 5 nm, the dislocation blocking effect of the third region 109a may be deteriorated and the dislocation bending effect of the fourth region 109b may be deteriorated. If the thickness of the second undoped AlGaN-based semiconductor layer 109 exceeds 15 nm, crystallinity may be deteriorated by a difference in lattice constant due to a high composition.

The third undoped GaN layer 106c may be located on the second undoped AlGaN-based semiconductor layer 109. A thickness of the third undoped GaN layer 106c may be 800 nm or more. For example, a thickness of the third undoped GaN layer 106c may be 800 nm to 1500 nm. If the thickness of the third undoped GaN layer 106c is less than 800 nm, a dislocation bending effect may be deteriorated.

The second undoped AlGaN-based semiconductor layer 109 is located on the second undoped GaN layer 106b and the second nitride layer 107b, so that the ultraviolet light emitting diode according to another embodiment can further improve crystallinity and can improve dislocation passed through the first undoped AlGaN-based semiconductor layer 108.

The ultraviolet light emitting diode according to another embodiment is described such that the first undoped AlGaN-based semiconductor layer 108 is located on the first nitride layer 107a and the second undoped AlGaN-based semiconductor layer 109 is located on the second nitride layer 107b, but is not limited thereto. At least two or more pairs of the first undoped AlGaN-based semiconductor layer 108 and the second undoped GaN layer 106b may be alternatively formed on the first nitride layer 107a, and least two or more pairs of the second undoped AlGaN-based semiconductor layer 109 and the third undoped GaN layer 106c may be alternately formed on the second nitride layer 107b.

TABLE 1

| | Comparative Example | Experimental Example 1 | Experimental Example 2 | Experimental Example 3 |
|---|---|---|---|---|
| nAlGaN (002) | 158/169 | 154/159 | 145/148 | 120/129 |
| nAlGaN(102) | 197/207 | 181/195 | 175/192 | 162/160 |

Table 1 is data comparing crystallinity and threading dislocation density (TDD) between a comparative example in which an undoped AlGaN-based semiconductor layer is not formed on an undoped GaN layer and experimental examples 1 to 3 in which the ultraviolet light emitting diode according to another embodiment of FIG. 8 including the first and second undoped AlGaN-based semiconductor layers on the undoped GaN layer is applied. Here, the crystallinity may be compared between a center region and an edge region of a wafer. In addition, XRD measurement is data obtained by measuring a surface 002 and a surface 102 of a first conductive AlGaN-based semiconductor layer.

Experimental example 1 includes first and second undoped AlGaN-based semiconductor layers having the Al composition x of 0.4 and a thickness of 5 nm, experimental example 2 includes first and second undoped AlGaN-based semiconductor layers having the Al composition x of 0.4 and a thickness of 10 nm, and experimental example 3 includes first and second undoped AlGaN-based semiconductor layers having the Al composition x of 0.6 and the thickness of 10 nm.

It can be seen that XRD FWHM of experimental examples 1 to 3 is lower than that of the comparative example, and thus crystallinity is improved.

Figure 9A:
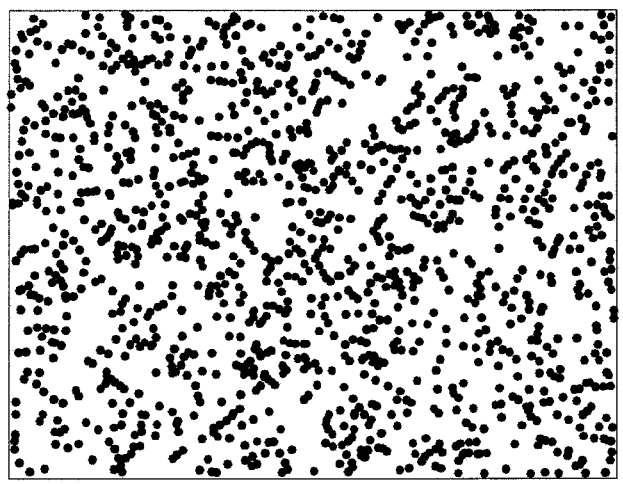
FIGS. 9A and 9B are TD density comparison photographs of comparative examples and experimental examples.
Figure 9B:
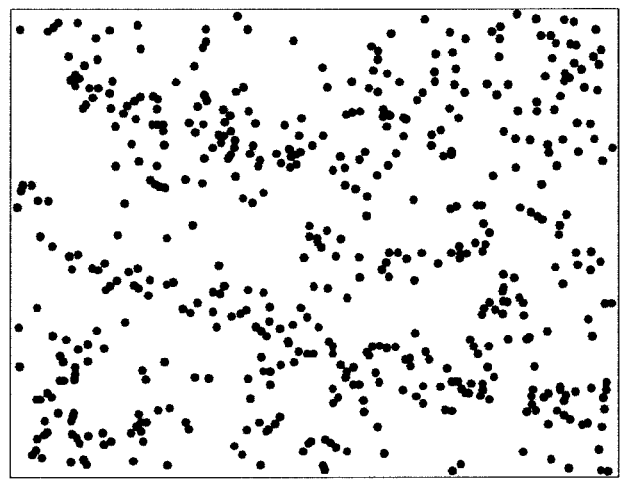

FIGS. 9A and 9B are TD density comparison photographs of a comparative example and experimental examples.

Indium (In) composition of a light emitting structure of an ultraviolet light emitting diode is lower than that of a blue light emitting diode, and thus the In restraining effect is hardly observed. The ultraviolet light emitting diode causes a decrease in brightness due to non-radiative recombination in a vicinity of threading dislocation (TD) in a lower layer of the light emitting structure. Therefore, in the ultraviolet light emitting diode, the light emitting structure, TD control of the lower layer of the light emitting structure, and crystallinity may greatly affect chip brightness.

FIG. 9A illustrates TD of a comparative example in which an undoped AlGaN semiconductor layer is not formed on an undoped GaN layer and a first conductive AlGaN-based semiconductor layer is formed, and FIG. 9B illustrates TD of an experimental example in which a first conductive AlGaN-based semiconductor layer is formed after first and second undoped AlGaN-based semiconductor layers are formed on an undoped GaN layer. In an embodiment, dislocation is bent by the undoped AlGaN-based semiconductor layer, and thus TD can be greatly reduced. Therefore, in the ultraviolet light emitting diode of an embodiment, a composition of indium (In) is low and thus non-radiative recombination in TD can be reduced.

Therefore, in an embodiment, the undoped AlGaN-based semiconductor layer is formed on the nitride layer to reduce TD and improve crystallinity, and thus can improve chip brightness as compared with the comparative example.

The ultraviolet light emitting diode according to an embodiment may have a structure in which a plurality of ultraviolet light emitting diodes are arrayed, and may be included in a light emitting diode package. The ultraviolet light emitting diode according to an embodiment may be used in various fields such as curing, sterilization, special lighting, and the like depending on wavelengths.

The ultraviolet light emitting diode according to an embodiment may be applied to a backlight unit, a lighting device, a display device, a display device for a vehicle, a smart unit, and the like, but is not limited thereto.

Figure 10:
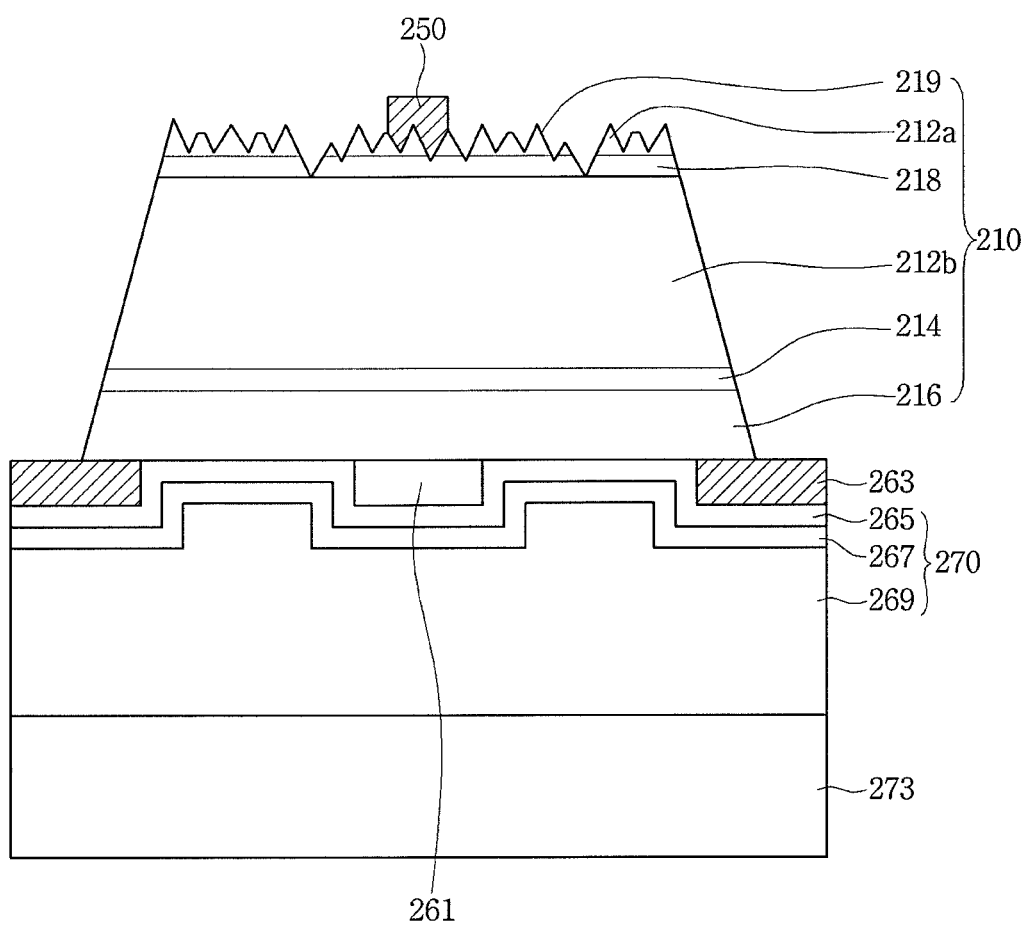
FIG. 10 is a cross-sectional view illustrating an ultraviolet light emitting diode according to another embodiment.
Figure 11:
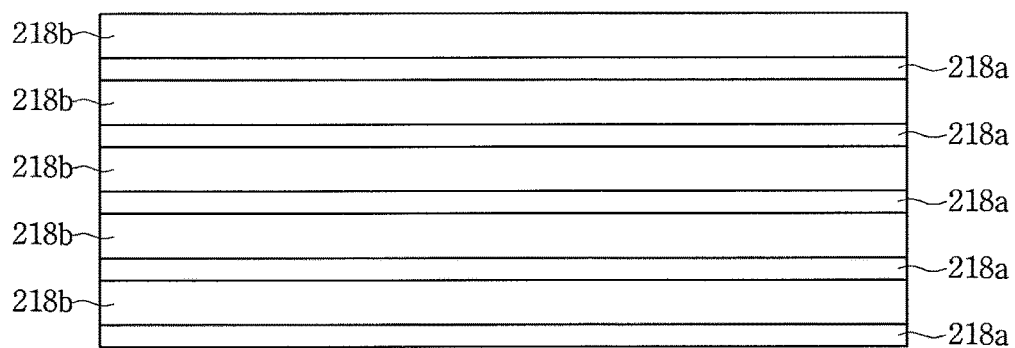
FIG. 11 is a cross-sectional view illustrating an etching stop layer of FIG. 10.
Figure 17:
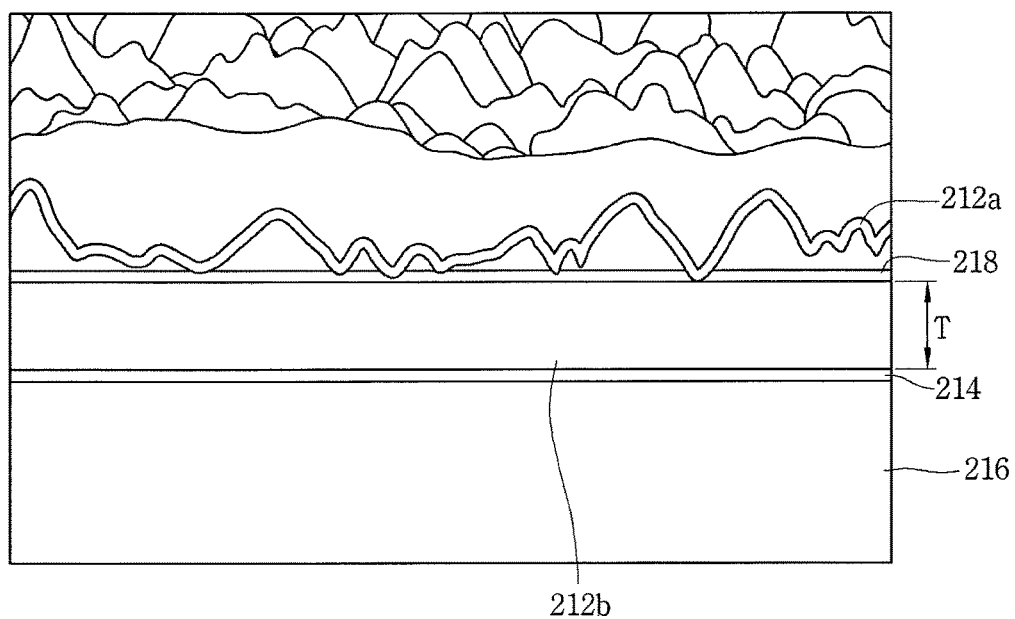
FIG. 17 is a photograph of an ultraviolet light emitting diode of another embodiment.

FIG. 10 is a cross-sectional view illustrating an ultraviolet light emitting diode according to another embodiment, FIG. 11 is a cross-sectional view illustrating an etching stop layer of FIG. 10, and FIG. 17 is a cross-sectional view illustrating an ultraviolet light emitting diode according to another embodiment.

As shown in FIGS. 10, 11 and 17, the ultraviolet light emitting diode according to an embodiment may include a light emitting structure 210.

The light emitting structure 210 may include a first conductive AlGaN-based first semiconductor layer 212a, an etching stop layer 218, a first conductive AlGaN-based second semiconductor layer 212b, an active layer 214, and a second conductive AlGaN-based semiconductor layer 216.

The first conductive AlGaN-based first semiconductor layer 212a and the first conductive AlGaN-based second semiconductor layer 212b may be formed of a semiconductor compound, for example, a compound semiconductor such as Group III and Group V, and Group II and Group VI or the like, and a first conductive dopant may be doped. For example, the first conductive AlGaN-based first semiconductor layer 212a and the first conductive AlGaN-based second semiconductor layer 212b may include a semiconductor material having a composition formula of $Al_nGa_{1-n}N$ ($0 \le n \le 1$). When the first conductive AlGaN-based first semiconductor layer 212a and the first conductive AlGaN-based second semiconductor layer 212b are n-type semiconductor layers, the first conductive AlGaN-based first semiconductor layer 212a and the first conductive AlGaN-based second semiconductor layer 212b may include Si, Ge, Sn, Se, and Te as a n-type dopant, but is not limited thereto.

The first conductive AlGaN-based first semiconductor layer 212a may include a light extraction pattern 219 for improving light extraction efficiency. The light extraction pattern 219 may be formed by a method such as PEC, and is not limited thereto. The light extraction pattern 219 may be formed to have a regular shape and arrangement, and may be formed to have an irregular shape and arrangement. The light extraction pattern 219 is formed such that light generated from the active layer 214 refracts light totally reflected and reabsorbed from an upper surface of the first conductive AlGaN-based first semiconductor layer 212a to outside, and thus the light extraction efficiency can be improved.

A thickness of the first conductive AlGaN-based second semiconductor layer 212b may be 1500 nm or more. For example, a thickness of the first conductive AlGaN-based second semiconductor layer 212b may be 1500 to 2500 nm, and is not limited thereto.

The etching stop layer 218 may limit a formation depth of the light extraction pattern 219. For example, the etching stop layer 218 may include an AlN 218a and a first conductive AlGaN-based third semiconductor layer 218b. Al of the AlN 218a has binding energy greater than that of Ga of the first conductive AlGaN-based first semiconductor layer 212a. Accordingly, an etching rate of the etching stop layer 218 may be slower than that of the first conductive AlGaN-based first semiconductor layer 212a. Therefore, while the light extraction pattern 219 is formed by etching of the first conductive AlGaN-based second semiconductor layer 212b, in the light extraction pattern 219, it is difficult to have a depth penetrating the etching stop layer 218 due to a slow etching rate of the etching stop layer 218. The etching stop layer 218 may be formed such that the AlN 218a and the first conductive AlGaN-based third semiconductor layer 218b are alternately formed in five or more pairs. For example, the etching stop layer 218 may be formed by alternating the AlN 218a and the first conductive AlGaN-based third semiconductor layer 218b in 5 to 15 pairs. If the AlN 218a and the first conductive AlGaN-based third semiconductor layer 218b are less than 5 pairs, an etching blocking effect of the etching stop layer 218 may be deteriorated. If the AlN 218a and the first conductive AlGaN-based third semiconductor layer 218b exceeds 15 pairs, crystallinity of the etching stop layer 218 may be deteriorated due to a difference in lattice constant.

A thickness of the AlN 218a may be 0.5 nm or more. For example, a thickness of the AlN 218a may be 0.5 to 3 nm. If the thickness of the AlN 218a is less than 0.5 nm, the etching blocking effect may be deteriorated. If the thickness of the AlN 218a is more than 3 nm, the crystallinity may be deteriorated by the AlN 218a having a small lattice, and carrier injection efficiency may be deteriorated.

A thickness of the first conductive AlGaN-based third semiconductor layer 218b may be 1 nm or more. For example, a thickness of the first conductive AlGaN-based third semiconductor layer 218b may be 1 to 5 nm. If the thickness of the first conductive AlGaN-based third semiconductor layer 218b is less than 1 nm, an electron spreading effect may be deteriorated, and if the thickness of the first conductive AlGaN-based third semiconductor layer 218b is more than 5 nm, the etching blocking effect may be deteriorated.

In the ultraviolet light emitting diode of an embodiment, the etching stop layer 218 is formed between the first conductive AlGaN-based first semiconductor layer 212a and the first conductive AlGaN-based second semiconductor layer 212b, and limits a depth of the light extraction pattern 219, thereby improving overetching. Thus, the ultraviolet light emitting diode of an embodiment can improve reduction of a yield due to a short.

In addition, the ultraviolet light emitting diode of an embodiment may include a dislocation blocking effect by the AlN 218a and the first conductive AlGaN-based third semiconductor layer 218b, which are alternately formed in five or more pairs.

The active layer 214 may be formed with at least one of a single quantum well structure, a multi quantum well (MQW) structure, a quantum-wire structure, and a quantum dot structure.

The active layer 214 is a layer which emits light due to a difference in band gap of an energy band depending on the materials forming the active layer 214 when electrons (or holes) injected into the first conductive AlGaN-based semiconductor layer 212 combine with holes (or electrons) injected into the second conductive AlGaN-based semiconductor layer 216.

The active layer 214 may be formed with a compound semiconductor. For example, the active layer 214 may be formed with at least one of Group II and Group IV, and Group III and Group V compound semiconductors.

The active layer 214 may include a quantum well and a quantum barrier. When the active layer 214 is formed as a multi quantum well structure, a quantum well and a quantum barrier may be alternately disposed. The quantum well and the quantum barrier may be disposed of a semiconductor material having a composition formula of $In_xAl_yGa_{1-x-y}$ ($0 \leq x \leq 1$, $0 \leq y \leq 1$, $0 \leq x+y \leq 1$), or be formed of one or more pairs of AlGaN/GaN, AlGaN/AlGaN, InGaN/GaN, InGaN/InGaN, InAlGaN/GaN, GaAs/AlGaAs, InGaAs/AlGaAs, GaP/AlGaP, and InGaP/AlGaP, but is not limited thereto.

The second conductive AlGaN-based semiconductor layer 216 may be formed of a semiconductor compound, for example, a compound semiconductor such as Group III and Group V, Group II and Group VI, or the like, and may be doped with a second conductive dopant. For example, the second conductive AlGaN-based semiconductor layer 216 may include a semiconductor material having a composition formula of $Al_pGa_{1-p}N$ ($0 \leq p \leq 1$). When the second conductive AlGaN-based semiconductor layer 216 is a p-type semiconductor layer, the second conductive dopant may include Mg, Zn, Ca, Sr, or Ba as a p-type dopant.

Although the first conductive AlGaN-based first semiconductor layer 212a and the first conductive AlGaN-based second semiconductor layer 212b are described as an n-type semiconductor layer, and the second conductive AlGaN-based semiconductor layer 216 is described as a p-type semiconductor layer, the first conductive AlGaN-based first semiconductor layer 212a and the first conductive AlGaN-based second semiconductor layer 212b may be formed of a p-type semiconductor layer, and the second conductive AlGaN-based semiconductor layer 216 may be formed of an n-type semiconductor layer, and is not limited thereto. A semiconductor such as an n-type semiconductor layer (not shown) having a polarity opposite to that of the second conductive type may be formed on the second conductive AlGaN-based semiconductor layer 216. Accordingly, the light emitting structure 210 may be formed as any one of an n-p junction structure, a p-n junction structure, an n-p-n junction structure, and a p-n-p junction structure.

Although the light emitting structure 210 of an embodiment is described as the first conductive AlGaN-based first semiconductor layer 212a, the first conductive AlGaN-based second semiconductor layer 212b, and the second conductive AlGaN-based semiconductor layer 216, the light emitting structure 210 may be formed of the first conductive GaN-based first semiconductor layer, the first conductive GaN-based second semiconductor layer, and the second conductive GaN-based semiconductor layer, and is not limited thereto.

The ultraviolet light emitting diode of an embodiment may include a first electrode 250.

The first electrode 250 may be located on the first conductive AlGaN-based second semiconductor layer 212a. The second electrode 270 may be located below the second conductive AlGaN-based semiconductor layer 216. Here, the light emitting structure 210 may include a first conductive AlGaN-based first semiconductor layer 212a, an etching stop layer 218, a first conductive AlGaN-based second semiconductor layer 212b, an active layer 214, and a second conductive AlGaN-based semiconductor layer 216, which are formed in one direction. That is, the first electrode 250 may be located on an upper surface of the light emitting structure 210, and the second electrode 270 may be located on a lower surface of the light emitting structure 210.

The ultraviolet light emitting diode of the embodiment may include a current blocking layer 261, a channel layer 263, and the second electrode 270 under the light emitting structure 210.

The current blocking layer 261 may be disposed below the light emitting structure 210 and in direct contact with the light emitting structure 210. The current blocking layer 261 may be disposed below the second conductive AlGaN-based semiconductor layer 216 and in direct contact with the second conductive AlGaN-based semiconductor layer 216. The current blocking layer 261 may be disposed between the light emitting structure 210 and the second electrode 270. A width of the first electrode 250 may be smaller than the current blocking layer 261. The current blocking layer 261 may be vertically overlapped with the first electrode 250. For example, a center portion of the current blocking layer 261 may be vertically overlapped with the first electrode 250, and an edge of the current blocking layer 261 may not be vertically overlapped with the first electrode 250, but is not limited thereto.

*The current blocking layer 261 may include at least one of $SiO_2$, $SiO_x$, $SiO_xN_y$, $Si_3N_4$, $Al_2O_3$, and $TiO_2$, and at least one of the current blocking layer 261 may be formed between the light emitting structure 210 and the second electrode 270.

The current blocking layer 261 is disposed so as to correspond to the thickness direction of the light emitting structure 210 and the first electrode 250 disposed on the light emitting structure 210. The current blocking layer 261 may block a current supplied from the second electrode 270 and spread the current to another path. That is, the current blocking layer 261 may block the current flowing in a shortest distance between the first electrode 250 and the second electrode 270, and spread the current to an edge path of the light emitting structure 210, thereby improving the current spreading.

The channel layer 263 may be formed along the periphery of a lower surface of the second conductive AlGaN-based semiconductor layer 216, and be formed in a ring shape, a loop shape, or a frame shape. The channel layer 263 may include at least one of ITO, IZO, IZTO, IAZO, IGZO, IGTO, AZO, ATO, $SiO_2$, $SiO_x$, $SiO_xN_y$, $Si_3N_4$, $Al_2O_3$, and $TiO_2$. An inner portion of the channel layer 263 may be disposed below the second conductive AlGaN-based semiconductor layer 216 and an outer portion may be disposed further outward than a side surface of the light emitting structure 210.

The second electrode 270 may include a contact layer 265, a reflective layer 267, and a bonding layer 269. The contact layer 265, the reflective layer 267 and the bonding layer 269 may be disposed under the current blocking layer 261 and the light emitting structure 210. The contact layer 265, the reflective layer 267 and the bonding layer 269 may be disposed under the current blocking layer 261 and a conductive AlGaN-based semiconductor layer 216.

A cross-section of the contact layer 265 may include a concave portion in contact with the current blocking layer 261 and a convex portion in contact with the second conductive AlGaN-based semiconductor layer 216. In addition, an edge of the cross-section of the contact layer 265 may have a concave portion in contact with the channel layer 263. Cross-sections of the reflective layer 267 and the bonding layer 269 may include a convex portion and a concave portion corresponding to the convex portion and the concave portion of the contact layer 265.

The contact layer 265 may be in direct contact with the current blocking layer 261 and the light emitting structure 210. The reflective layer 267 is disposed below the contact layer 265 and may be in direct contact with the contact layer 265. The reflective layer 267 may be disposed between the contact layer 265 and the bonding layer 269. The bonding layer 269 is disposed below the contact layer 265 and the reflective layer 267 and may be in direct contact with the reflective layer 267.

The contact layer 265 may be formed by stacking a single metal, a metal alloy, a metal oxide, or the like in multiple layers so that carrier injection can be performed efficiently. The contact layer 265 may be formed of a material having excellent electrical contact with the semiconductor. For example, the contact layer 265 may be formed to include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au, and Hf, but is not limited thereto.

The reflective layer 267 may be located on the contact layer 265. The reflective layer 267 may be formed of a material having excellent reflectivity and excellent electrical contact. For example, the reflective layer 267 may be formed of a metal or an alloy including at least one of Ag, Ni, Al, Rh, Pd, Ir, Ru, Mg, Zn, Pt, Au, and Hf.

In addition, the reflective layer 267 may be formed of a single layer or multilayer using the metal or alloy and a light transmitting conductive material such as IZO, IZTO, IAZO, IGZO, IGTO, AZO, ATO and the like, and for example, may be stacked with IZO/Ni, AZO/Ag, IZO/Ag/Ni, AZO/Ag/Ni and the like.

The bonding layer 269 is formed under the reflective layer 267 and the bonding layer 269 may be used as a barrier metal or a bonding metal. The material may include at least one of, for example, Ti, Au, Sn, Ni, Cr, Ga, In, Bi, Cu, Ag, Ta, and an alloy selected therefrom.

A support member 273 is formed under the bonding layer 269, the support member 273 may be formed of a conductive member, and the material may be formed of a conductive material such as copper (Cu), gold (Au), nickel (Ni), molybdenum (Mo), copper-tungsten (Cu—W), carrier wafers such as Si, Ge, GaAs, ZnO, SiC, and the like. As another example, the support member 273 may be formed of a conductive sheet.

Although the ultraviolet light emitting diode of an embodiment is described as a vertical type, the electrodes may be applied to a horizontal type located on the upper surface of the light emitting structure 210.

In the ultraviolet light emitting diode of an embodiment, the etching stop layer 218 is formed between the first conductive AlGaN-based first semiconductor layer 212a and the first conductive AlGaN-based second semiconductor layer 212b, and the depth of the light extraction pattern 219 is limited to the etching stop layer 218 under the first conductive AlGaN-based second semiconductor layer 212b, thereby improving reduction of a yield due to a short in the first conductive AlGaN-based second semiconductor layer 212b.

In addition, the ultraviolet light emitting diode of an embodiment may improve crystallinity of the light emitting structure 210 by a dislocation blocking effect due to the etching stop layer 218 including the AlN 218a and the first conductive AlGaN-based third semiconductor layer 218b alternately formed in five pairs or more.

FIGS. 12 to 16 are cross-sectional views illustrating a method of manufacturing an ultraviolet light emitting diode according to an embodiment.

Figure 12:
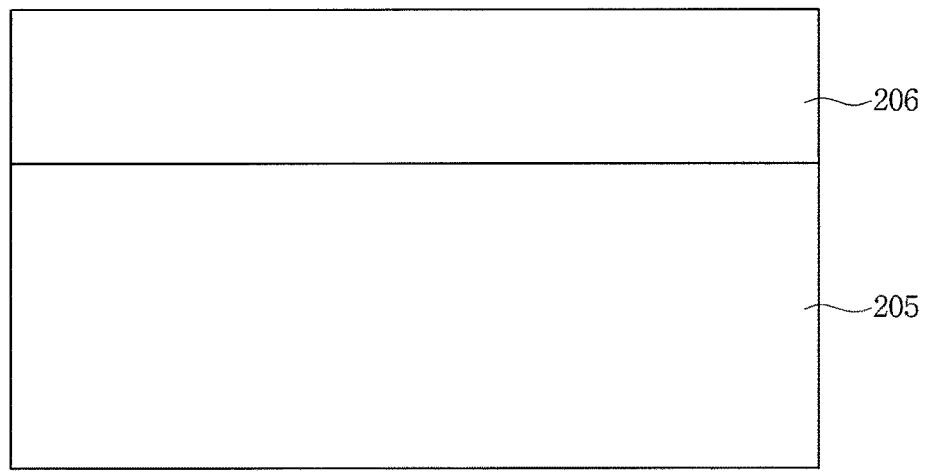
FIGS. 12 to 16 are cross-sectional views illustrating a method of manufacturing an ultraviolet light emitting diode according to another embodiment.

Referring to FIG. 12, a buffer layer 206 may be formed on a substrate 205.

The substrate 205 may be formed of a material having superior thermal conductivity, and may be a conductive substrate or an insulating substrate. For example, the substrate 205 may use at least one of sapphire ($Al_2O_3$), SiC, Si, GaAs, GaN, ZnO, GaP, InP, Ge, and $Ga_2O_3$. A concavo-convex structure may be formed on the substrate 205, and is not limited thereto.

The buffer layer 206 serves to reduce a difference in a lattice constant between the substrate 205 and a nitride semiconductor layer, and a material thereof may be selected from GaN, AlN, AlGaN, InGaN, InN, InAlGaN, AlInN, AlGaAs, GaP, GaAs, GaAsP, AlGaInP and the like. For example, the buffer layer 206 may be undoped GaN, but is not limited thereto.

The buffer layer 206 may be at least one or more. That is, the buffer layer 206 may be a plurality of two or more layers.

Figure 13:
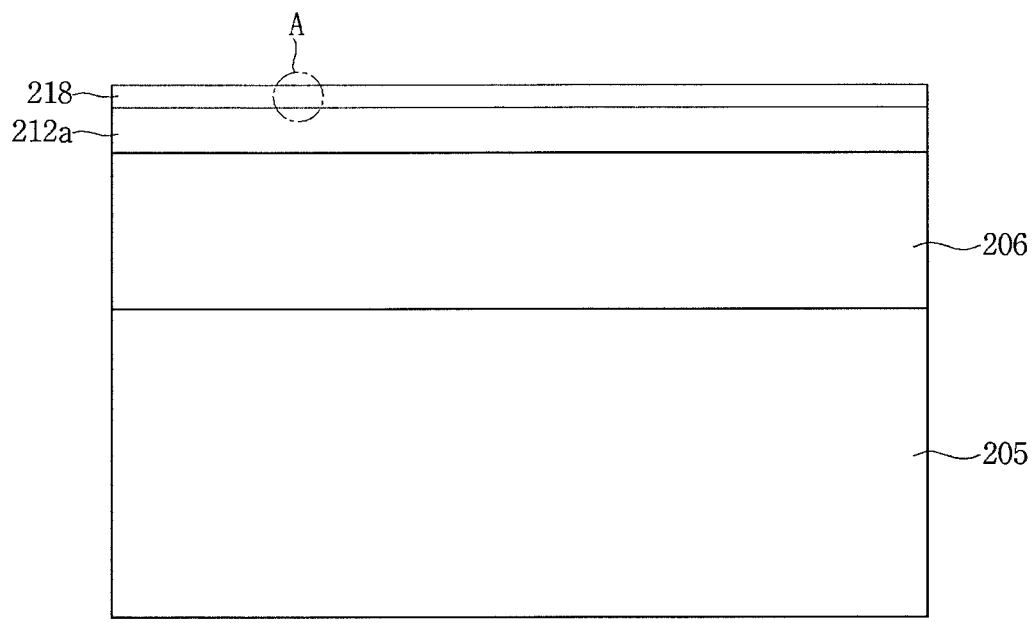

Referring to FIG. 13, the first conductive AlGaN-based first semiconductor layer 212a may be formed on the buffer layer 206.

The first conductive AlGaN-based first semiconductor layer 212a may be formed of a semiconductor compound, for example, a compound semiconductor such as Group III and Group V, Group II and Group VI, or the like, and may be doped with a first conductive dopant. For example, the second conductive AlGaN-based first semiconductor layer 212a may include a semiconductor material having a composition formula of $Al_nGa_{1-n}N$ ($0 \le n \le 1$). When the first conductive AlGaN-based first semiconductor layer 212a is an n-type semiconductor layer, the first conductive AlGaN-based first semiconductor layer 212a may include Si, Ge, Sn, Se, or Te as an n-type dopant, but is not limited thereto. The etching stop layer 218 may be formed on the second conductive AlGaN-based first semiconductor layer 212a.

Figure 14:
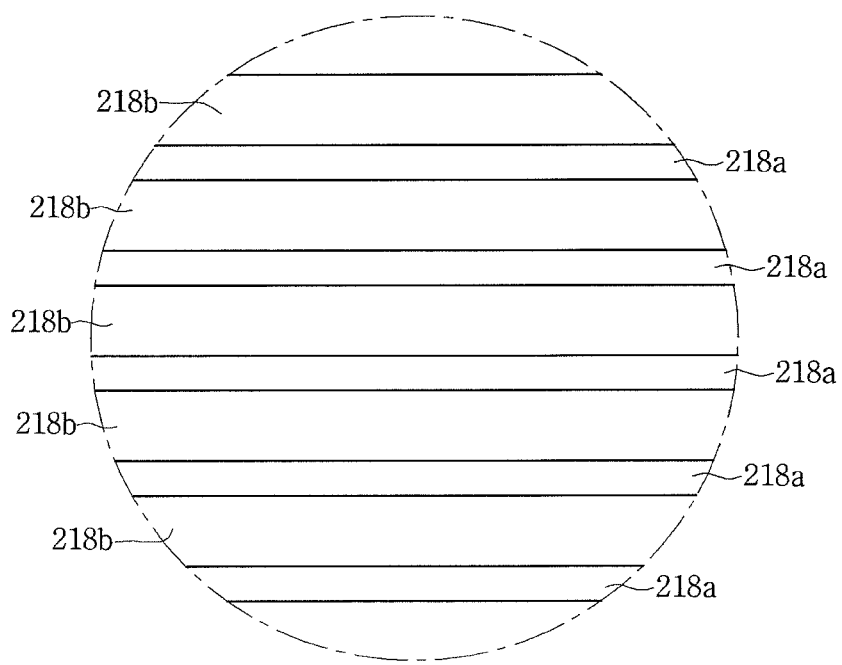

FIG. 14 is a view illustrating A of FIG. 13.

Referring to FIGS. 13 and 14, the etching stop layer 218 may be formed on the first conductive AlGaN-based first semiconductor layer 212a. The etching stop layer 218 may include a function of limiting a depth of a light extraction pattern formed on the first conductive AlGaN-based first semiconductor layer 212a by PEC or the like.

The etching stop layer 218 may be formed such that the AlN 218a and the first conductive AlGaN-based third semiconductor layer 218b are alternately formed in five or more pairs. For example, the etching stop layer 218 may be formed by alternating the AlN 218a and the first conductive AlGaN-based third semiconductor layer 218b in 5 to 15 pairs. If the AlN 218a and the first conductive AlGaN-based third semiconductor layer 218b are less than 5 pairs, an etching blocking effect of the etching stop layer 218 may be deteriorated. If the AlN 218a and the first conductive AlGaN-based third semiconductor layer 218b exceeds 15 pairs, crystallinity of the etching stop layer 218 may be deteriorated due to a difference in lattice constant.

A thickness of the AlN 218a may be 0.5 nm or more. For example, a thickness of the AlN 218a may be 0.5 to 3 nm. If the thickness of the AlN 218a is less than 0.5 nm, an etching blocking effect may be deteriorated. If the thickness of the AlN 218a is more than 3 nm, crystallinity may be deteriorated by the AlN 218a having a small lattice, and carrier injection efficiency may be deteriorated.

A thickness of the first conductive AlGaN-based third semiconductor layer 218b may be 1 nm or more. For example, a thickness of the first conductive AlGaN-based third semiconductor layer 218b may be 1 to 5 nm. If the thickness of the first conductive AlGaN-based third semiconductor layer 218b is less than 1 nm, a current spreading effect may be deteriorated, and if the thickness of the first conductive AlGaN-based third semiconductor layer 218b is more than 5 nm, the etching blocking effect may be deteriorated.

Figure 15:
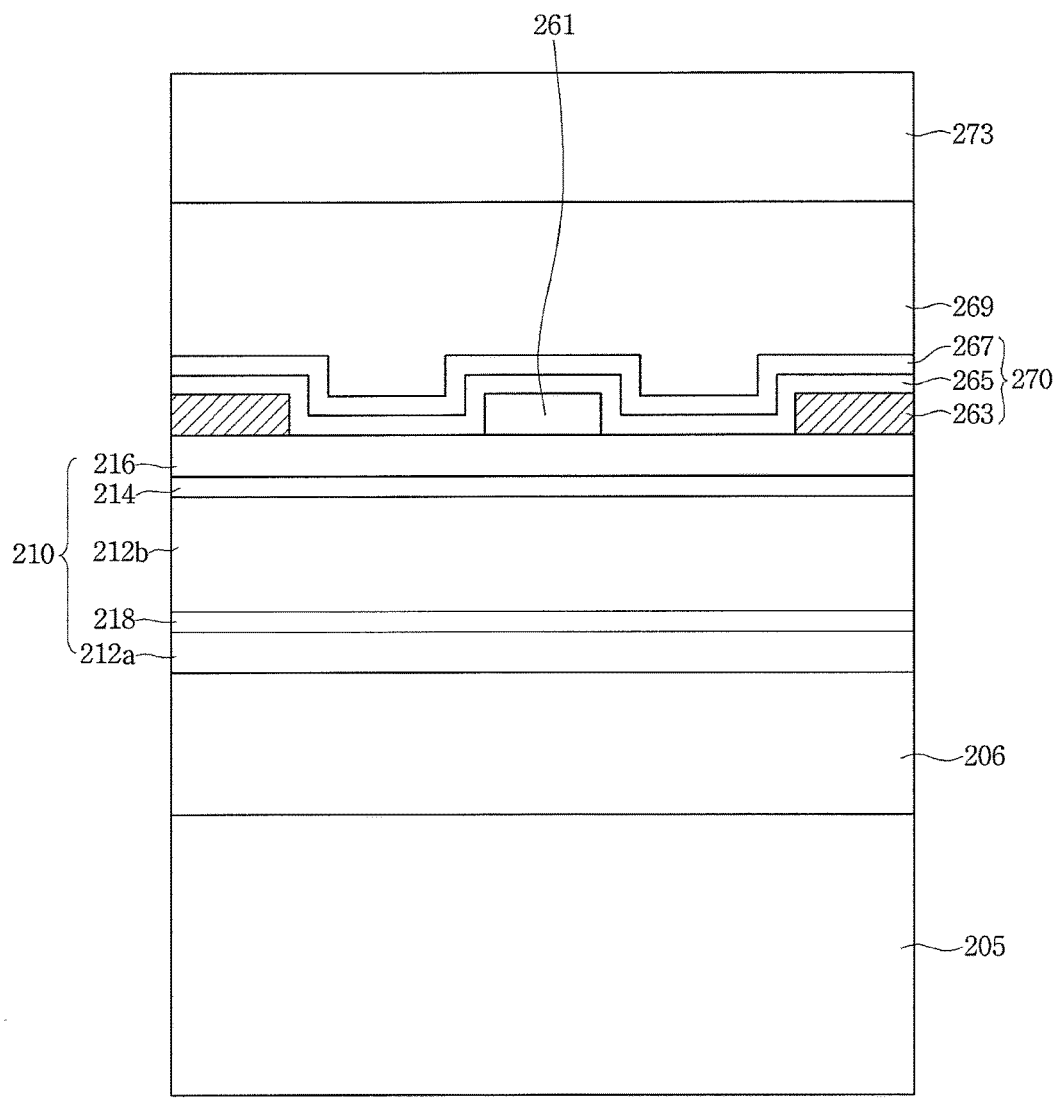

Referring to FIG. 15, the first conductive AlGaN-based second semiconductor layer 212b may be formed on the etching stop layer 218.

The first conductive AlGaN-based second second semiconductor layer 212b may be formed of a semiconductor compound, for example, a compound semiconductor such as Group III and Group V, Group II and Group VI, or the like, and may be doped with a first conductive dopant. For example, the second conductive AlGaN-based second semiconductor layer 212b may include a semiconductor material having a composition formula of $Al_nGa_{1-n}N$ ($0 \le n \le 1$). When the first conductive AlGaN-based second semiconductor layer 212b is an n-type semiconductor layer, the first conductive AlGaN-based second semiconductor layer 212b may include Si, Ge, Sn, Se, or Te as an n-type dopant, but is not limited thereto.

A thickness of the first conductive AlGaN-based second semiconductor layer 212b may be 1500 nm or more. For example, a thickness of the first conductive AlGaN-based second semiconductor layer 212b may be 1500 to 2500 nm, and is not limited thereto.

The active layer 214 may be formed on the first conductive AlGaN-based second semiconductor layer 212b, and the second conductive AlGaN-based semiconductor layer 216 may be formed on the active layer 214.

The active layer 214 may be formed with at least one of the single quantum well structure, the multi quantum well (MQW) structure, the quantum-wire structure, and the quantum dot structure.

The active layer 214 is a layer which emits light due to a difference in band gap of an energy band depending on the materials forming the active layer 214 when electrons (or holes) injected into the first conductive AlGaN-based first semiconductor layer 212a and the first conductive AlGaN-based second semiconductor layer 212b combine with holes (or electrons) injected into the second conductive AlGaN-based semiconductor layer 216.

The active layer 214 may be formed with a compound semiconductor. For example, the active layer 214 may be formed with at least one of Group II and Group IV, and Group III and Group V compound semiconductors.

The active layer 214 may include a quantum well and a quantum barrier. When the active layer 214 is formed as a multi quantum well structure, a quantum well and a quantum barrier may be alternately disposed. The quantum well and the quantum barrier may be disposed of a semiconductor material having a composition formula of $In_xAl_yGa_{1-x-y}$ ($0 \leq x \leq 1$, $0 \leq y \leq 1$, $0 \leq x+y \leq 1$), or be formed of one or more pairs of AlGaN/GaN, AlGaN/AlGaN, InGaN/GaN, InGaN/InGaN, InAlGaN/GaN, GaAs/AlGaAs, InGaAs/AlGaAs, GaP/AlGaP, and InGaP/AlGaP, but is not limited thereto.

The second conductive AlGaN-based semiconductor layer 216 may be formed of a semiconductor compound, for example, a compound semiconductor such as Group III and Group V, Group II and Group VI, or the like, and may be doped with a second conductive dopant. For example, the second conductive AlGaN-based semiconductor layer 216 may include a semiconductor material having a composition formula of $Al_pGa_{1-p}N$ ($0 \leq p \leq 1$). When the second conductive AlGaN-based semiconductor layer 216 is a p-type semiconductor layer, the second conductive dopant may include Mg, Zn, Ca, Sr, or Ba as a p-type dopant.

The first conductive AlGaN-based first semiconductor layer 212a and the first conductive AlGaN-based second semiconductor layer 212b may be formed of a p-type semiconductor layer, and the second conductive AlGaN-based semiconductor layer 216 may be formed of a n-type semiconductor layer, and is not limited thereto.

A second electrode layer 220 may be formed on the second conductive AlGaN-based first semiconductor layer 216. The second electrode layer 220 may include a contact layer 222, a reflective layer 224, and a conductive support member 226.

The contact layer 222 may be formed by stacking a single metal, a metal alloy, a metal oxide, or the like in multiple layers so that carrier injection can be performed efficiently. The contact layer 222 may be formed of a material having excellent electrical contact with the semiconductor. For example, the contact layer 222 may be formed to include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au, and Hf, but is not limited thereto.

The reflective layer 224 may be formed on the contact layer 222. The reflective layer 224 may be formed of a material having excellent reflectivity and excellent electrical contact. For example, the reflective layer 224 may be formed of a metal or an alloy including at least one of Ag, Ni, Al, Rh, Pd, Ir, Ru, Mg, Zn, Pt, Au, and Hf.

In addition, the reflective layer 224 may be formed of a multilayer using the metal or alloy and a light transmitting conductive material such as IZO, IZTO, IAZO, IGZO, IGTO, AZO, ATO and the like, and for example, may be stacked with IZO/Ni, AZO/Ag, IZO/Ag/Ni, AZO/Ag/Ni and the like.

Then, the conductive support member 226 may be formed on the reflective layer 224.

The conductive support member 226 may be formed of a metal, a metal alloy, or a conductive semiconductor material having excellent electrical conductivity so that a carrier can be efficiently injected. For example, the conductive support member 226 may be formed of a material such as copper (Cu), gold (Au), copper alloy (Cu Alloy), nickel (Ni), copper-tungsten (Cu—W), a carrier wafer such as Ge, GaAs, ZnO, SiGe, and SiC.

As a method of forming the conductive support member 226, an electrochemical metal deposition method, a bonding method using a eutectic metal, or the like may be applied.

Figure 16:
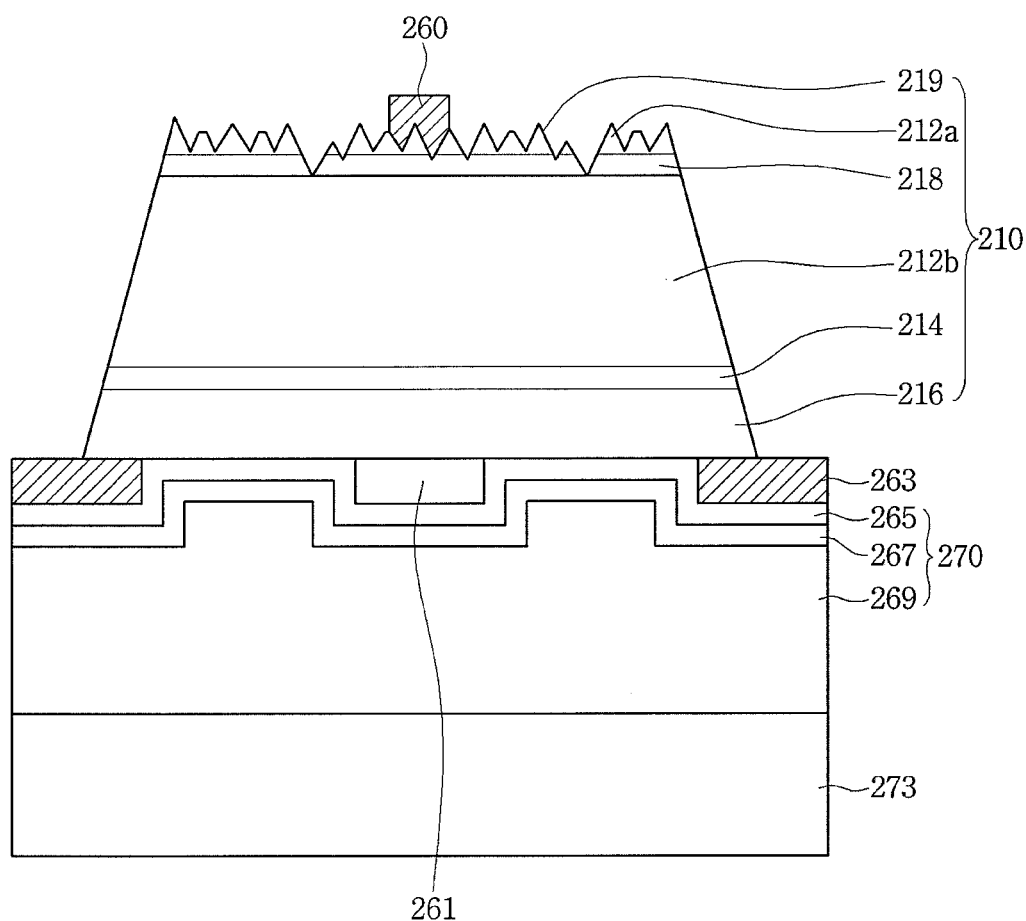

Referring to FIGS. 15 and 16, the substrate 205 and the buffer layer 206 may be removed from the light emitting structure 210. For example, the substrate 205 and the buffer layer 206 may be removed by a chemical etching method.

A light extraction pattern 219 for improving light extraction efficiency may be formed on the first conductive AlGaN-based first semiconductor layer 212a exposed by removing the substrate 205 and the buffer layer 206. The light extraction pattern 219 may be formed by a method such as PEC, and is not limited thereto. The light extraction pattern 219 may be formed to have a regular shape and arrangement, and may be formed to have an irregular shape and arrangement.

The light extraction pattern 219 may improve light extraction efficiency by refracting light generated from the active layer 214 to outside.

In the ultraviolet light emitting diode of an embodiment, the etching stop layer 218 is formed between the first conductive AlGaN-based first semiconductor layer 212a and the first conductive AlGaN-based second semiconductor layer 212b, and the depth of the light extraction pattern 219 is limited to the etching stop layer 218 under the first conductive AlGaN-based second semiconductor layer 212b, thereby improving reduction of a yield due to a short in the first conductive AlGaN-based second semiconductor layer 212b.

In addition, the ultraviolet light emitting diode of an embodiment may improve crystallinity of the light emitting structure 210 by a dislocation blocking effect due to the etching stop layer 218 including the AlN 218a and the first conductive AlGaN-based third semiconductor layer 218b alternately formed in five pairs or more.

FIG. 17 is a photograph of the ultraviolet light emitting diode of an embodiment.

As shown in FIG. 17, the ultraviolet light emitting diode of an embodiment may include the etching stop layer 218 that limits a depth of the light extraction pattern. The etching stop layer 218 blocks the overetching of the light extraction pattern by limiting the depth of the light extraction pattern of the first conductive AlGaN-based first semiconductor layer 212a to the etching stop layer 218, and thus a distance T between the active layer 214 and the first conductive AlGaN-based second semiconductor layer 212b can be kept constant.

The ultraviolet light emitting diode of an embodiment limits the depth of the light extraction pattern to the etching stop layer 218, and thus reduction of a yield due to a short of the first conductive AlGaN-based second semiconductor layer can be improved.

In addition, the ultraviolet light emitting diode of an embodiment may improve crystallinity of the light emitting structure by a dislocation blocking effect due to the etching stop layer 218 including the AlN and the first conductive AlGaN-based semiconductor layer alternately formed in five pairs or more.

Figure 18:
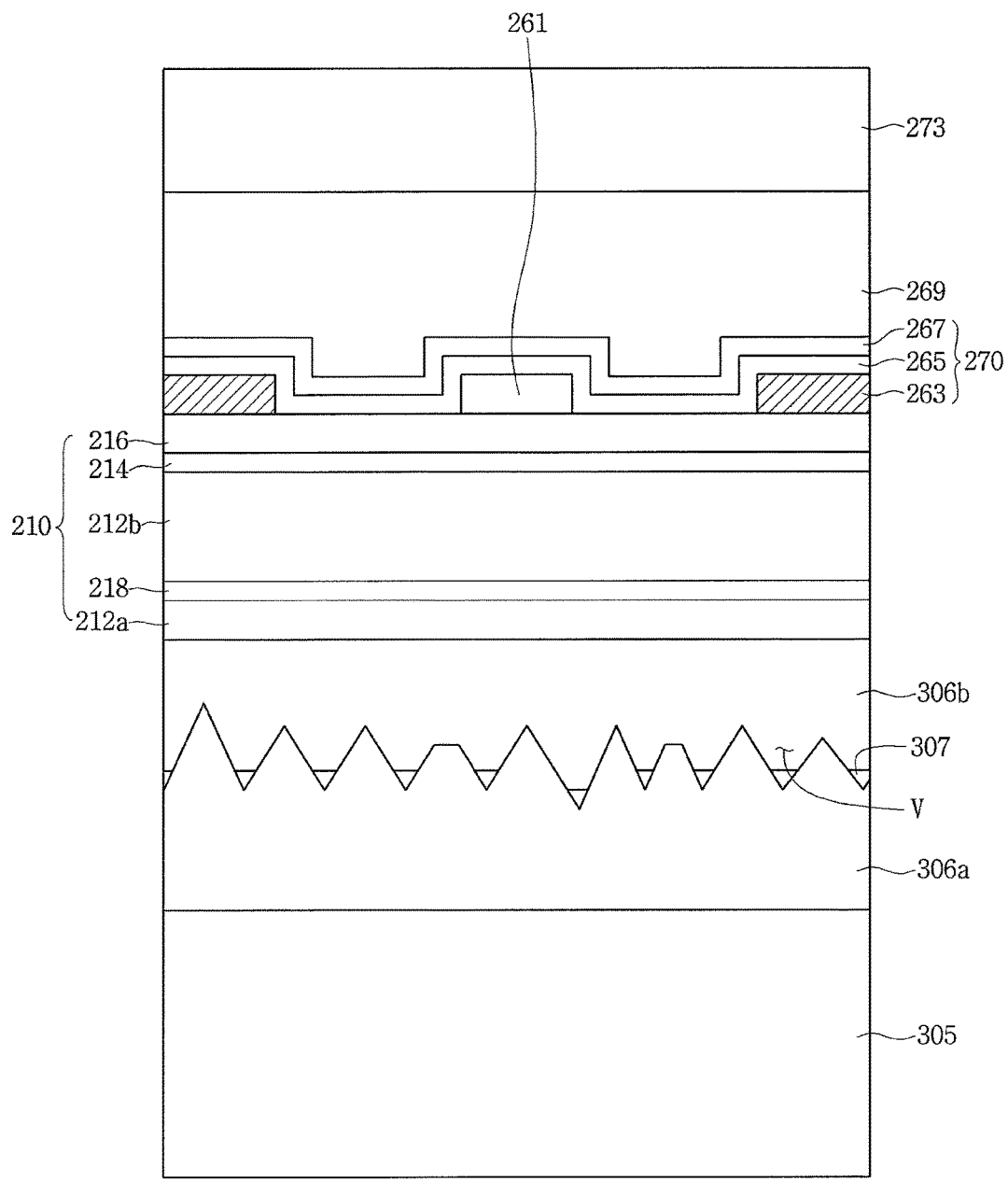
FIGS. 18 and 19 are cross-sectional views illustrating an ultraviolet light emitting diode according to another embodiment.
Figure 19:
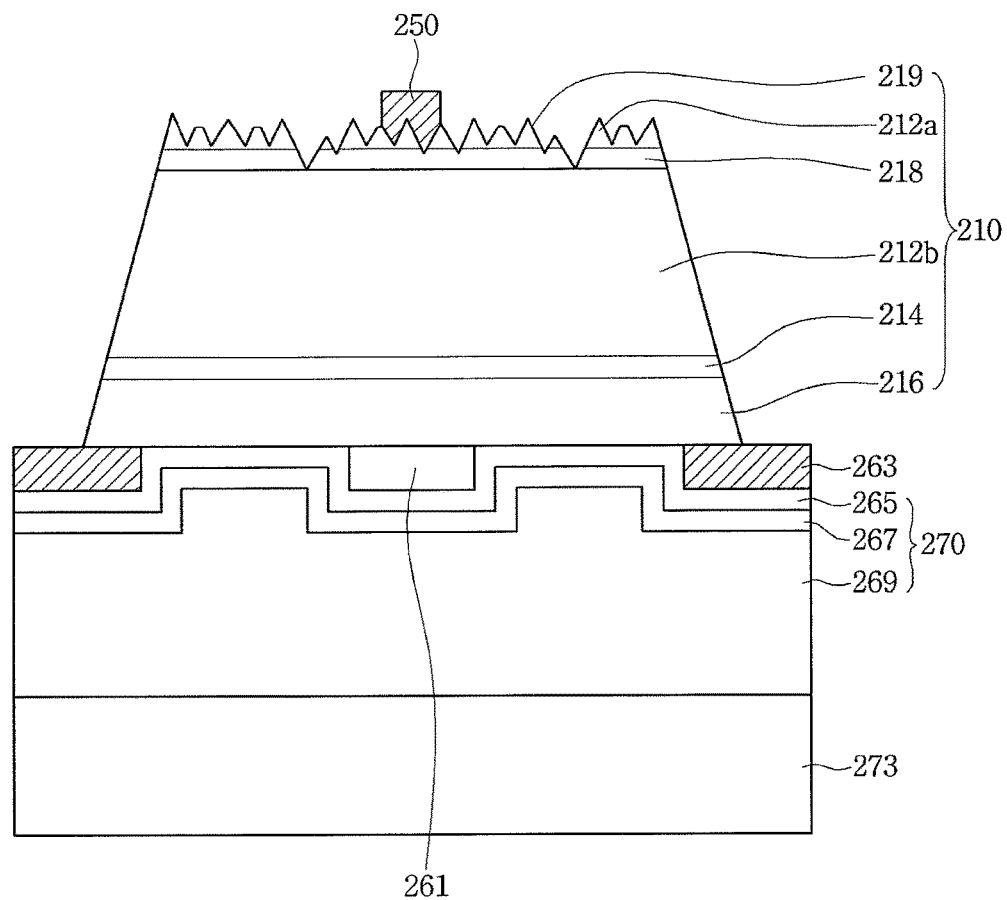

FIGS. 18 and 19 are cross-sectional views illustrating an ultraviolet light emitting diode according to another embodiment.

As shown in FIGS. 18 and 19, the ultraviolet light emitting diode according to another embodiment may adopt technical features of the ultraviolet light emitting diode according to an embodiment of FIG. 1.

The ultraviolet light emitting diode according to another embodiment may include a first undoped GaN layer 306a, a nitride layer 307, and a second undoped GaN layer 306b.

At least one or more of the first undoped GaN layer 306a may be formed. That is, the first undoped GaN layer 306a may be formed in plurality of two or more layers. The first undoped GaN layer 306a may include a plurality of V-pits V by controlling a growth temperature or a growth pressure. For example, the first undoped GaN layer 306a may reduce mobility of Ga by adjusting a growth temperature, a growth pressure, or the like, and thus a first undoped GaN layer 306a including roughness can be formed. For example, the first undoped GaN layer 306a may be formed such that at least a part thereof has a side surface and an upper surface, and the side surfaces may be formed to include the plurality of V-pits V. For example, the roughness may be formed regularly or irregularly, and is not limited thereto.

The nitride layer 307 may be formed on the first undoped GaN layer 306a. The nitride layer 307 may be located within the V-pits V. The nitride layer 307 may be formed at a lower end of the V-pits V. The nitride layer 307 may include SiNx (x>0), but is not limited thereto. The nitride layer 307 may be disposed within the V-pits V of the first undoped GaN layer 306a to block a dislocation at the lower end of the V-pits V. For example, the nitride layer 307 is formed of an amorphous material and is formed at the lower end of the V-pits V of the first undoped GaN layer 306a, and thus can reduce a propagation of dislocation occurring at the lower end of the V-pits to the second undoped GaN layer 306b and bend a path through which a dislocation propagates. The nitride layer 307 may also be located on the upper surface of the first undoped GaN layer 306a in addition to the lower end of the V-pits V, and is not limited thereto.

In the ultraviolet light emitting diode according to another embodiment, the nitride layer 307 may be formed on the V-pits VI of the first undoped GaN layer 306a having V-pits V, and the second undoped GaN layer 306a may be formed on the nitride layer 307 to improve dislocation, thereby improving crystallinity.

The ultraviolet light emitting diode according to an embodiment may have a structure in which a plurality of ultraviolet light emitting diodes are arrayed, and may be included in a light emitting diode package. The ultraviolet light emitting diode according to the embodiments may be used in various fields such as curing, sterilization, special lighting, and the like depending on wavelengths.

The ultraviolet light emitting diode according to an embodiment may be applied to a backlight unit, a lighting device, a display device, a display device for a vehicle, a smart unit, and the like, but is not limited thereto.

In the ultraviolet light emitting diode of another embodiment, a light extraction pattern 219 may be formed on a first conductive AlGaN-based first semiconductor layer 212a exposed by removing the substrate 305, first undoped GaN layer 306a, nitride layer 307, and second undoped GaN layer 306b. The light extraction pattern 219 and the first electrode 250 may adopt technical features of the ultraviolet light emitting diode according to an embodiment of FIGS. 10 to 16.

In the ultraviolet light emitting diode of another embodiment, an etching stop layer 218 is formed between the first conductive AlGaN-based first semiconductor layer 212a and the first conductive AlGaN-based second semiconductor layer 212b, and a depth of the light extraction pattern 219 is limited to the etching stop layer 218 under the first conductive AlGaN-based second semiconductor layer 212b, thereby improving reduction of a yield due to a short in the first conductive AlGaN-based second semiconductor layer 212b.

In addition, the ultraviolet light emitting diode of an embodiment may improve crystallinity of the light emitting structure 210 by a dislocation blocking effect due to the etching stop layer 218 including AlN 218a and a first conductive AlGaN-based third semiconductor layer 218b alternately formed in five pairs or more.

Figure 20:
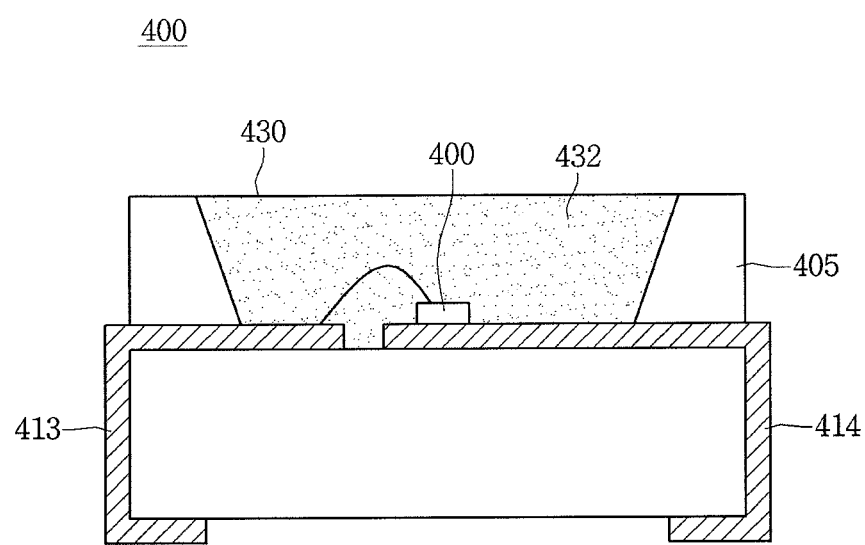
FIG. 20 is a cross-sectional view illustrating a light emitting diode package according to an embodiment.

FIG. 20 is a cross-sectional view illustrating a light emitting diode package according to an embodiment.

A light emitting diode package 400 according to an embodiment includes a package body 405, a first lead electrode 413 and a second lead electrode 414 provided on the package body 405, an ultraviolet light emitting diode 100 installed on the package body 405 and electrically connected to the first lead electrode 413 and the second lead electrode 414, and a molding member 430 surrounding the ultraviolet light emitting diode 100.

The first lead electrode 413 and the second lead electrode 414 are electrically separated from each other and serve to supply power to the ultraviolet light emitting diode 100. The first lead electrode 413 and the second lead electrode 414 may include a function of increasing light efficiency by reflecting light emitted from the ultraviolet light emitting diode 100 and a function of discharging heat generated from the ultraviolet light emitting diode 100 to outside.

The ultraviolet light emitting diode 100 may be electrically connected to the first lead electrode 413 or the second lead electrode 414 by one of a wire method, a flip chip method and a die bonding method.

The ultraviolet light emitting diode 100 may be an ultraviolet light emitting diode according to one embodiment, but is not limited thereto, and the ultraviolet light emitting diode 100 may be an ultraviolet light emitting diode according to another embodiment.

The molding member 430 may include a phosphor 432 to form a light emitting diode package of white light, but is not limited thereto.

An upper surface of the molding member 430 may be flat, concave or convex, and is not limited thereto.

The characteristics, structures and effects described in the embodiments above are included in at least one embodiment but are not limited to one embodiment. Furthermore, the characteristic, structure, and effect illustrated in each embodiment may be combined with or modified for other embodiments by a person skilled in the art. Thus, it would be construed that contents related to such a combination and such a variation are included in the scope of the present invention.

Embodiments are mostly described above. However, they are only examples and do not limit the present invention. A person skilled in the art may appreciate that several variations and applications not presented above may be made without departing from the essential characteristics of embodiments. For example, elements of the exemplary embodiments described herein may be modified and realized. In addition, it should be construed that differences related to such a variation and such an application are included in the scope of the present invention defined in the following claims.

The invention claimed is:

1. An ultraviolet light emitting diode, comprising:
   a substrate;
   a first undoped GaN layer including a V-pit having an upper surface and a side surface on at least a part of the substrate;
   a first nitride layer on the V-pit of the first undoped GaN layer;
   a first undoped AlGaN-based semiconductor layer on the first undoped GaN layer and the first nitride layer; and
   a second undoped GaN layer on the first undoped AlGaN-based semiconductor layer,
   wherein the first undoped AlGaN-based semiconductor layer includes a first region on the upper surface of the first undoped GaN layer and a second region on the V-pit of the first undoped GaN layer, and
   wherein an Al concentration of the first region is greater than that of the second region.

2. The ultraviolet light emitting diode of claim 1, wherein the first undoped AlGaN-based semiconductor layer has an Al composition of $Al_xGa_{1-x}N$ ($0.4 \leq x \leq 0.8$).

3. The ultraviolet light emitting diode of claim 1, wherein the first undoped AlGaN-based semiconductor layer has a thickness of 5 to 15 nm.

4. The ultraviolet light emitting diode of claim 1, wherein the second undoped GaN layer has a thickness of 800 to 1500 nm.

5. The ultraviolet light emitting diode of claim 1, wherein the first undoped AlGaN-based semiconductor layer and the second undoped GaN layer have at least two pairs disposed on the first nitride layer.

6. The ultraviolet light emitting diode of claim 1, wherein the second undoped GaN layer includes an upper surface and a V-pit,
   further comprising:
   a second nitride layer on the V-pit of the second undoped GaN layer;
   a second undoped AlGaN-based semiconductor layer on the second undoped GaN layer and the second nitride layer; and
   a third undoped GaN layer on the second undoped AlGaN-based semiconductor layer,
   wherein the second undoped AlGaN-based semiconductor layer includes a third region on an upper surface of the second undoped GaN layer and a fourth region on the V-pit of the second undoped GaN layer, and
   wherein an Al concentration of the third region is greater than that of the fourth region.

7. An ultraviolet light emitting diode, comprising:
   a first electrode;
   a first conductive first semiconductor layer disposed under the first electrode and having a light extraction structure;
   a stop layer under the first conductive first semiconductor layer;
   a first conductive second semiconductor layer under the stop layer;
   an active layer under the first conductive second semiconductor layer;
   a second conductive semiconductor layer under the active layer;
   a second electrode disposed under the second conductive semiconductor layer and vertically overlapped with a portion of the first electrode; and
   a channel layer disposed along a periphery between the second electrode and second conductive semiconductor layer,
   wherein the stop layer includes an AlN layer and a first conductive third semiconductor layer, the AlN layer and the first conductive third semiconductor layer being alternately disposed at at least five pairs, and the first conductive first semiconductor layer, the first conductive second semiconductor layer, and the first conductive third semiconductor layer each includes a first conductive AlGaN-based semiconductor layer, and
   wherein the first conductive third semiconductor layer has a thickness of 1 to 5 nm.

8. The ultraviolet light emitting diode of claim 7, wherein the first conductive third semiconductor layer is alternately disposed at at least 5 to 15 pairs.

9. The ultraviolet light emitting diode of claim 7, wherein the AlN layer has a thickness of 0.5 to 3 nm.

10. A light emitting diode package comprising the ultraviolet light emitting diode of claim 1.

11. A lighting device comprising the ultraviolet light emitting diode of claim 1.

12. The ultraviolet light emitting diode of claim 1, wherein the first nitride layer has an upper surface lower than the upper surface of the first undoped GaN layer.

13. The ultraviolet light emitting diode of claim 1, wherein the first nitride layer includes a silicon-based material.

14. The ultraviolet light emitting diode of claim 1, wherein the first undoped AlGaN-based semiconductor layer has a shape corresponding to that of the first undoped GaN layer.

15. The ultraviolet light emitting diode of claim 1, wherein the second undoped GaN layer has a lower surface having a shape that corresponds to that of the V-pit and the upper surface of the first undoped GaN layer.

* * * * *